United States Patent
Feng et al.

(10) Patent No.: US 9,966,733 B2
(45) Date of Patent: May 8, 2018

(54) INTEGRATION OF LASER INTO OPTICAL PLATFORM

(75) Inventors: Dazeng Feng, El Monte, CA (US); Mehdi Asghari, Pasadena, CA (US); Bradley Jonathan Luff, San Marino, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 952 days.

(21) Appl. No.: 13/506,629

(22) Filed: May 2, 2012

(65) Prior Publication Data

US 2013/0294472 A1    Nov. 7, 2013

(51) Int. Cl.

| | |
|---|---|
| H01S 5/50 | (2006.01) |
| H01S 5/042 | (2006.01) |
| H01S 5/22 | (2006.01) |
| H01S 5/32 | (2006.01) |
| H01S 5/026 | (2006.01) |
| H01S 5/10 | (2006.01) |
| H01S 5/125 | (2006.01) |
| H01S 5/30 | (2006.01) |
| G02B 6/12 | (2006.01) |

(52) U.S. Cl.
CPC ............ *H01S 5/0424* (2013.01); *H01S 5/22* (2013.01); *H01S 5/3201* (2013.01); *G02B 6/12004* (2013.01); *H01S 5/026* (2013.01); *H01S 5/0425* (2013.01); *H01S 5/1014* (2013.01); *H01S 5/1017* (2013.01); *H01S 5/125* (2013.01); *H01S 5/305* (2013.01)

(58) Field of Classification Search
CPC .......................................................... H01S 3/10
USPC .......... 372/50.22, 50.124, 45.01; 359/483.01
See application file for complete search history.

(56) References Cited

U.S. PATENT DOCUMENTS

| | | | |
|---|---|---|---|
| 4,997,246 A * | 3/1991 | May et al. ......................... 385/2 |
| 5,394,423 A * | 2/1995 | Kasahara ............ H01S 5/18355 |
| | | | 372/45.01 |
| 5,908,305 A * | 6/1999 | Crampton et al. ............ 438/141 |
| 7,049,641 B2 * | 5/2006 | Pan ............................... 257/188 |
| 2010/0207223 A1 * | 8/2010 | Feng et al. ..................... 257/432 |
| 2011/0068425 A1 * | 3/2011 | Liao et al. ..................... 257/432 |

OTHER PUBLICATIONS

Liu, et al., Ge-on-Si Laser Operating at Room Temperature, Mar. 1, 2010/vol. 35, No. 5/Optics Letters (pp. 679-681).
Liu, et al., Tensile Strained, n-type Ge as a gain medium for monolithic laser integration on Si, Sep. 3, 2007/ vol. 15, No. 18/Optics Express (pp. 11272-11277).
Michael et al., An Electrically Pumped Ge-on Si Laser, OFC/NFOEC, Postdeadline Papers 2012.

* cited by examiner

*Primary Examiner* — Tuan Nguyen
(74) *Attorney, Agent, or Firm* — Gavrilovich, Dodd & Lindsey, LLP

(57) ABSTRACT

An optical device includes a laser or amplifier positioned on a base. The laser includes a ridge of a gain medium positioned on the base such that the base extends out from under the ridge. The ridge includes a top that connects lateral sides of the ridge. Electronics are configured to drive an electrical current through the ridge such that the electrical current passes through one or more of the lateral sides of the ridge.

11 Claims, 20 Drawing Sheets

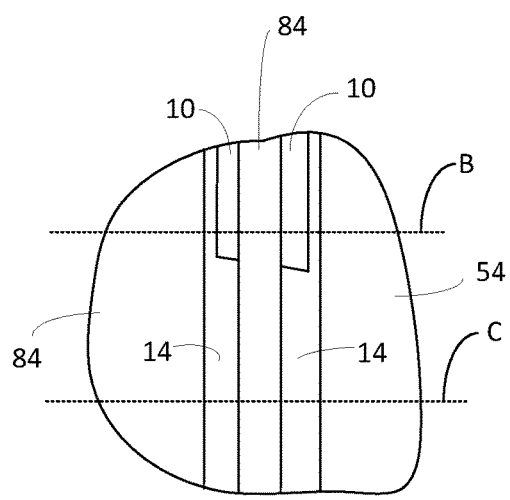
Figure 13A
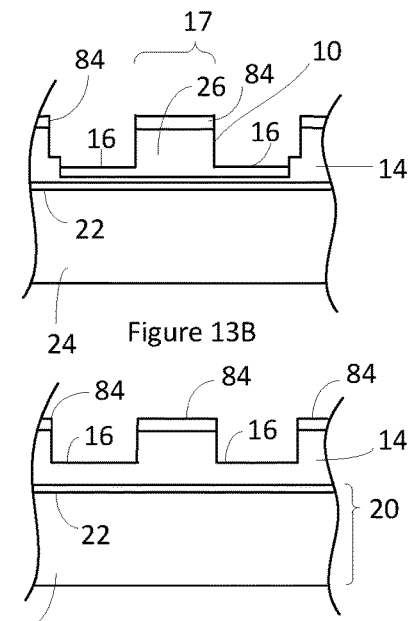
Figure 13B
Figure 13C
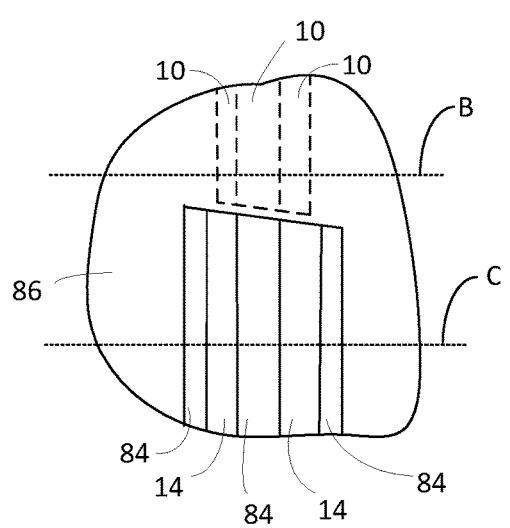
Figure 14A
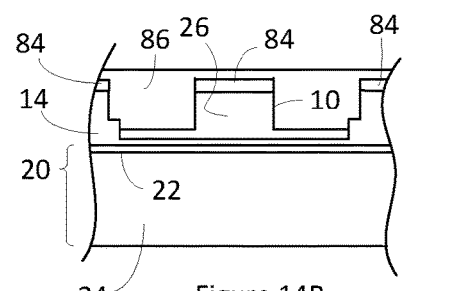
Figure 14B
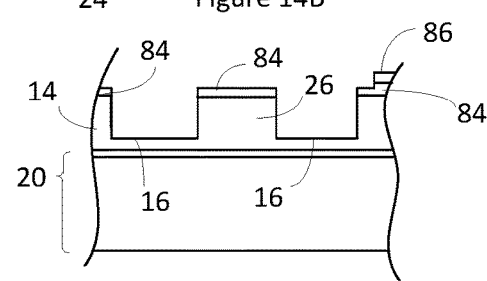
Figure 14C

INTEGRATION OF LASER INTO OPTICAL PLATFORM

FIELD

The present invention relates to optical devices and particularly, to incorporation of lasers and/or amplifiers into optical devices.

BACKGROUND

Silicon-on-insulator wafers have proven to be one of the most successful platforms for integrating multiple optical components into a single device. Since lasers are the source of the light signals that are processed by these devices, it is highly desirable to integrate lasers into these devices. These lasers generally employ group III-V materials as the gain medium. Group III-V materials include one or more group III materials and one or more group V materials. Integrating these lasers into a silicon platform generally requires that a group III-V material is grown on another material that includes or consists of silicon. Attempts to grow group III-V materials on a material that includes or consists of silicon have not been successful due to the lattice mismatch between the silicon and the group III-V materials. As a result, the lasers are generally not integrated into the device but are instead built on a separate platform and then attached to the device. The need to use external lasers with the optical device introduce costs, complexity and inefficiency into the device. As a result, there is a need for a laser that can be integrated into a planar optical device.

SUMMARY

An optical device includes a laser or amplifier positioned on a base. A ridge of a gain medium is positioned on the base. The ridge includes a top that connects lateral sides of the ridge. Electronics are configured to drive an electrical current through the ridge such that the electrical current passes through one or more of the lateral sides of the ridge.

Another embodiment of the device includes a laser or amplifier positioned on a base. A ridge of a gain medium is positioned on the base. The ridge includes a top and a bottom configured such that the bottom is between the top and the base. The top connects lateral sides of the ridge. Slab regions of the device are located on opposing sides of the ridge. Electronics are configured to drive an electrical current that flows from one of the slab regions to the slab region on the opposing side of the ridge with at least a portion of the electrical current passing through the ridge of the gain medium.

BRIEF DESCRIPTION OF THE FIGURES

FIG. 10A through FIG. 18C illustrate a method of generating an optical device having a laser or amplifier with a cross section according to FIG. 1B.

DESCRIPTION

The optical device includes a laser that uses a gain medium that can be grown directly onto a material that includes or consists of silicon using methods such as chemical vapour deposition (CVD), or low pressure chemical vapout deposition (LPCVD). For instance, the gain medium can be a semiconductor that is not a group III-V material. Many of the non-group III-V semiconductor materials that can be grown on a silicon containing material are indirect bandgap materials such as germanium. The indirect bandgap that characterizes these materials has made them difficult to use as a gain medium. However, the current laser construction employs one or more techniques to fill up one or more of the lowest energy indirect bandgaps with electrons until the next highest energy conduction band is a direct bandgap. This direct bandgap is then used as the source of photons in the laser.

In addition, the laser can be electrically pumped. For instance, the laser can be constructed such that a ridge of the gain medium extends upwards from slab regions located on opposing sides of the ridge. Electronics are configured to drive an electrical current that flows from one of the slab regions to the slab region on the opposing side of the ridge with at least a portion of the electrical current passing through the ridge of the gain medium. Because the electrical current flows between slab regions on opposing sides of the ridge rather than through the top and bottom of the ridge, the output of the laser can be received by waveguides having larger dimensions but without the use of vertical tapers between the laser and the waveguide. Since vertical tapers can be difficult to fabricate, eliminating these tapers can reduce the costs and complexity of the final device.

Figure 1A:
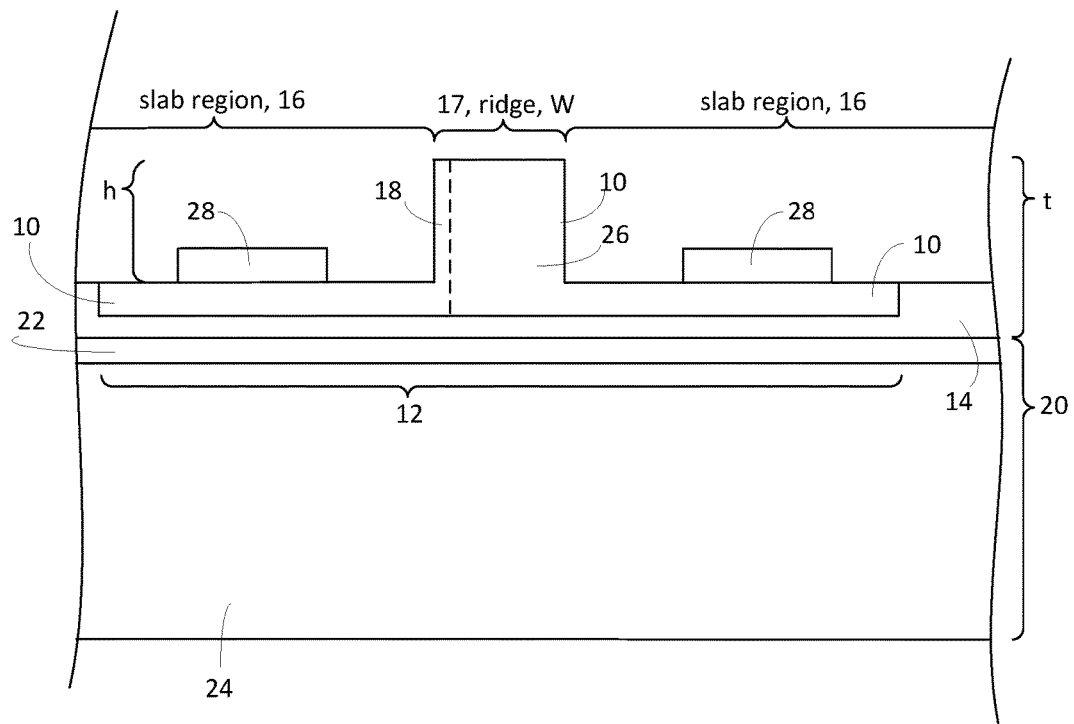
FIG. 1A through FIG. 1G are each a cross section of a different embodiment of a laser.

FIG. 1A is a cross section of a laser. The laser includes a gain medium 10 on a seed portion 12 of a light-transmitting medium 14. The gain medium 10 includes a ridge 17 that extends upwards from slab regions 16 positioned on opposing sides of the ridge. FIG. 1A shows the ridge 17 of the gain medium 10 extending upward from slab regions 16 of the gain medium 10. As will become evident below, the light-transmitting medium 14, the gain medium 10, or the base 20 can define the tops of the slab regions 16.

The ridge 17 of the gain medium 10 includes a top that connects lateral sides. At least one of the lateral sides includes an electrical conductor. In some instances, the electrical conductor is a doped region 18 of the gain medium 10 that is doped so as to make the doped region 18 electrically conducting. In the cross section of FIG. 1A, the perimeter of a portion of the doped region 18 is illustrated with a dashed line to prevent it from being confused with interfaces between different materials. The interfaces between different materials are illustrated with solid lines.

The gain medium 10 and light-transmitting medium 14 are positioned on a base 20. A suitable base 20 includes an optical insulator 22 (or cladding) on a substrate 24. In one example, the laser is constructed on a silicon-on-insulator 22 wafer. A silicon-on-insulator 22 wafer includes a silicon layer positioned on a base 20. The layer of silicon serves as the light-transmitting medium 14. The base 20 of the silicon-on-insulator 22 wafer also includes a layer of silica positioned on a silicon substrate. The layer of silica serves as the optical insulator 22 while the silicon substrate serves as a substrate 24 for the base 20.

The ridge 17 of the gain medium 10 also includes a gain doped region 26 that serves as the source of optical gain during the operation of the laser. FIG. 1A illustrates the gain doped region 26 contacting the doped region 18. The doped region 18 and the gain doped region 26 each extends into one of the slab regions 16 of the gain medium 10. An electrical contact 28 is in electrical communication with the portion of the doped region 18 located in one of the slab regions 16. For instance, the electrical contact 28 directly contacts the portion of doped region 18 located in the slab region 16 of the gain medium 10. Another electrical contact 28 is in electrical communication with the portion of gain doped region 26 located in one of the slab regions 16 of the gain medium 10. For instance, the electrical contact 28 directly contacts the portion of the gain doped region 26 located in the slab region 16 of the gain medium 10.

During operation of the laser, the laser is electrically pumped. For instance, electronics (not shown) apply electrical energy to the electrical contacts 28 such that an electrical current flows from one of the electrical contacts 28 to the other. The electrical current is conducted through the doped region 18 and the gain doped region 26. Since the electrical conductor contacts that lateral side of the ridge 17 of the gain medium 10, the electrical current flows through the ridge 17 of the gain medium 10. The flow of the electrical current through the gain doped region 26 provides the gain to the laser.

Figure 1B:
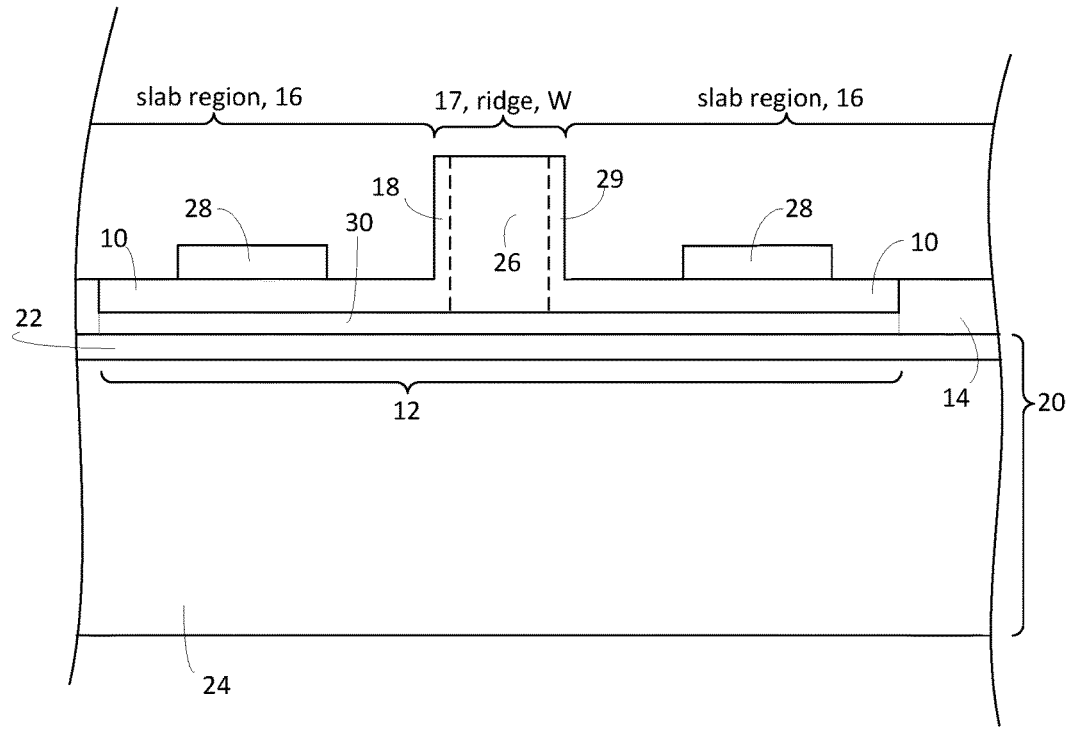

Electrical conductors can be formed on opposing lateral sides of the ridge 17 of gain medium 10. As an example, FIG. 1B is a cross section of the laser of FIG. 1A adapted such that each lateral sides of the ridge 17 of gain medium 10 includes an electrical conductor. Several doped regions 18 are shown in FIG. 1B. The perimeter of the doped regions 18 is illustrated with dashed lines to prevent them from being confused with interfaces between different materials. The interfaces between different materials are illustrated with solid lines.

The laser includes electrical conductors contacting the ridge 17 of the gain medium 10. One of the electrical conductors is a doped region 18 of the gain medium 10 that is doped so as to make the doped regions 18 electrically conducting. Another of the electrical conductors is a second doped region 29 of the gain medium 10 that is doped so as to make the second doped region 29 electrically conducting. FIG. 1B illustrates the gain doped region 26 contacting the doped region 18 and the second doped region 29. Additionally, the doped region 18 and the second doped region 29 each extends into one of the slab regions 16 of the gain medium 10.

An electrical contact 28 is in electrical communication with the portion of the doped region 18 located in one of the slab regions 16. For instance, the electrical contact 28 directly contacts the portion of doped region 18 located in the slab region 16 of the gain medium 10. Another electrical contact 28 is in electrical communication with the portion of second doped region 29 located in one of the slab regions 16 of the gain medium 10. For instance, the electrical contact 28 directly contacts the portion of the second doped region 29 located in the slab region 16 of the gain medium 10.

During operation of the laser, the laser is electrically pumped. For instance, electronics (not shown) apply electrical energy to the electrical contacts 28 such that an electrical current flows from one of the electrical contacts 28 to the other. The electrical current flows through the doped region 18, the gain doped region 26 and the second doped region 29. Since the doped region 18 and the second doped region 29 each extends up a lateral side of the ridge 17 of the gain medium 10, the electrical current flows through the ridge 17 of the gain medium 10. The flow of the electrical current through the gain doped region 26 provides the gain to the laser.

Figure 1C:
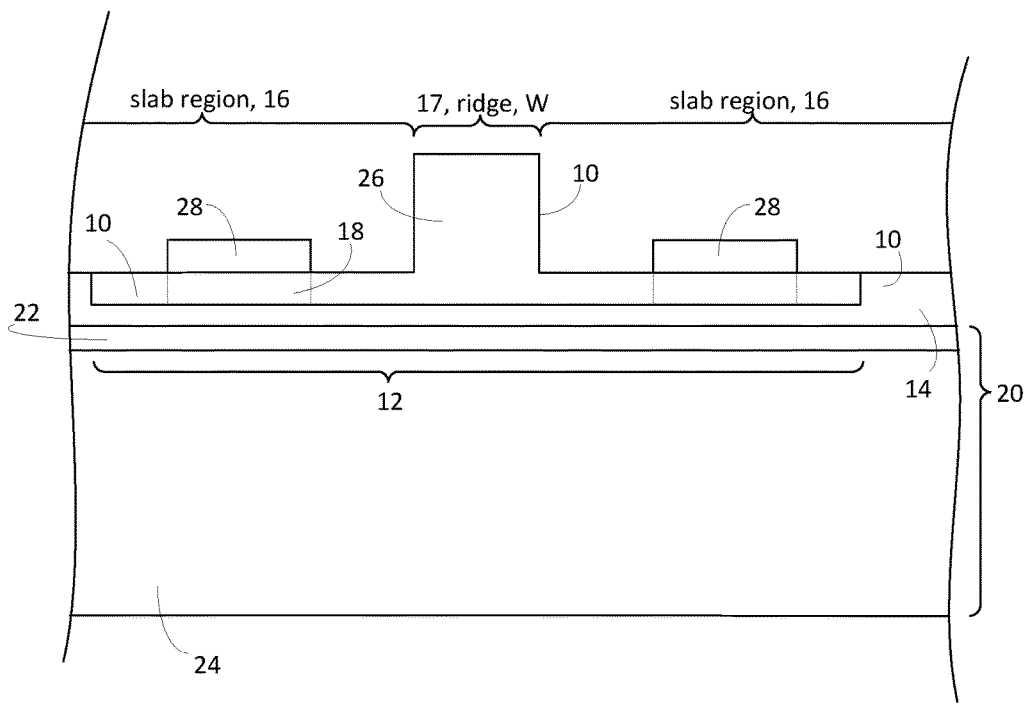

In some instances, the electrical conductors do not extend up the lateral sides of the ridge 17 of the gain medium 10. As an example, FIG. 1C is a cross section of the laser of FIG. 1A adapted such that the electrical conductors do not extend up either lateral sides of the ridge 17 of the gain medium 10. Several doped regions 18 are shown in FIG. 1C. The perimeter of the doped regions 18 is illustrated with dashed lines to prevent them from being confused with interfaces between different materials. The interfaces between different materials are illustrated with solid lines.

The laser includes electrical conductors spaced apart from the ridge 17 of the gain medium 10. One of the electrical conductors is a doped region 18 of the gain medium 10 that extends into one of the slab regions 16 of the gain medium 10. The doped region 18 is doped so as to make the doped region 18 electrically conducting. Another of the electrical conductors is a second doped region 29 of the gain medium 10 that extends into one of the slab regions 16 of the gain medium 10. The second doped region 29 is doped so as to make the second doped region 29 electrically conducting. FIG. 1C illustrates the gain doped region 26 contacting the doped region 18 and the second doped region 29.

An electrical contact 28 is in electrical communication with the doped region 18. For instance, the electrical contact 28 directly contacts the doped region 18. Another electrical contact 28 is in electrical communication with the second doped region 29. For instance, the electrical contact 28 directly contacts the second doped region 29.

During operation of the laser, the laser is electrically pumped. For instance, electronics (not shown) apply electrical energy to the electrical contacts 28 such that an electrical current flows from one of the electrical contacts 28 to the other. The electrical current flows through the doped region 18, the gain doped region 26 and the second doped region 29. When the electrical current has sufficient power, the electrical current enters the ridge 17 of the gain medium 10. The flow of the electrical current through the gain doped region 26 provides the gain to the laser.

The doped region 18 of FIG. 1A, FIG. 1B and FIG. 1C and the second doped region 29 of FIG. 1B and FIG. 1C are shown extending through the gain medium 10 down to the underlying light-transmitting medium 14; however, the doped region 18 and/or second doped region 29 can extend only part way into the slab region 16 of the gain medium 10 without extending down to the underlying light-transmitting medium 14.

Figure 1D:
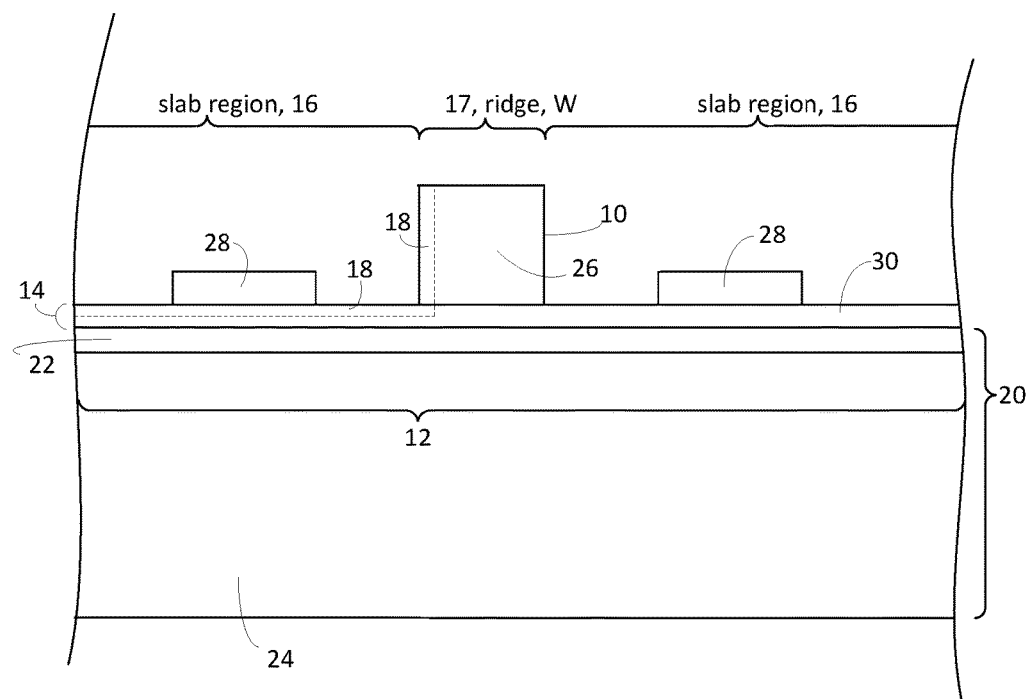

FIG. 1A through FIG. 1C show a ridge 17 of gain medium 10 extending upwards from slab regions 16 of the gain medium 10; however, the slab regions 16 can exclude the gain medium 10. For instance, the ridge 17 of gain medium 10 can extend upwards from slab regions 16 of the light-transmitting medium 14. FIG. 1D is a cross section of a laser where the ridge 17 of the gain medium 10 extends upwards from slab regions 16 of the light-transmitting medium 14. Several doped regions 18 are shown in FIG. 1D. The perimeter of the doped regions 18 is illustrated with dashed lines to prevent them from being confused with interfaces between different materials. The interfaces between different materials are illustrated with solid lines.

The laser includes an electrical conductor contacting the ridge 17 of the gain medium 10. The electrical conductor is a doped region 18 of the gain medium 10 that is doped so as to make the doped regions 18 electrically conducting. The doped region 18 also extends into one of the slab regions 16 of the light-transmitting medium 14. The portion of the doped region 18 extending into the lateral side of the gain medium 10 is continuous with the portion of the doped region 18 extending into the slab region 16 of the light-transmitting medium 14. As a result, the doped region 18 provides a continuous electrical pathway from the slab region 16 of the light-transmitting medium 14 to the lateral side of the ridge 17 of gain medium 10.

The seed portion 12 of the light-transmitting medium 14 also includes a third doped region 30 contacting the doped region 18 and the gain doped region 26. The third doped region 30 is positioned under one of the electrical contacts 28 and is in electrical communication with that electrical contact 28. For instance, that electrical contact 28 directly contacts the underlying portion of the third doped region 30.

During operation of the laser, the laser is electrically pumped. For instance, electronics (not shown) apply electrical energy to the electrical contacts 28 such that an electrical current flows from one of the electrical contacts 28 to the other. A portion of the electrical current flows through the one of the electrical contacts 28, the doped region 18, the third doped region 30 and then the other electrical contact 28. Since the doped region 18 contacts that lateral side of the ridge 17 of the gain medium 10, another portion of the electrical current flows through the one of the electrical contacts 28, the gain doped region 26, the third doped region 30, and then the other electrical contact 28. The flow of the electrical current through the gain doped region 26 provides the gain to the laser.

Figure 1E:
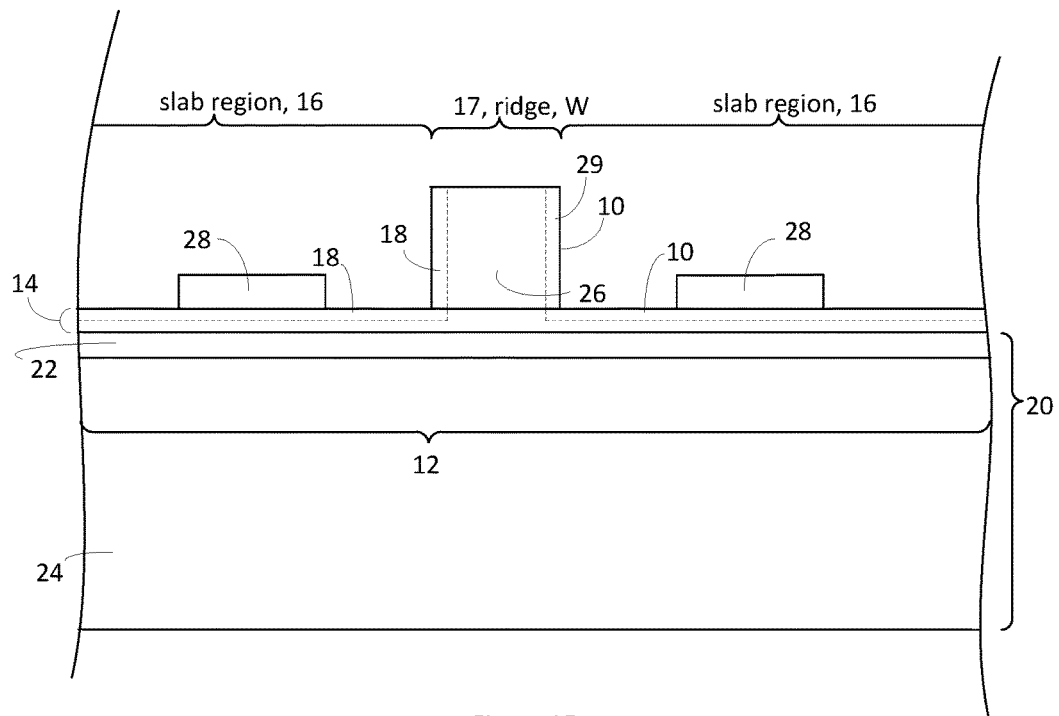

Electrical conductors can be formed on opposing lateral side of the ridge 17 of gain medium 10 shown in FIG. 1D. As an example, FIG. 1E is a cross section of the laser of FIG. 1D adapted such that each lateral sides of the ridge 17 of gain medium 10 includes an electrical conductor. Several doped regions 18 are shown in FIG. 1E. The perimeter of the doped regions 18 is illustrated with dashed lines to prevent them from being confused with interfaces between different materials. The interfaces between different materials are illustrated with solid lines.

The laser includes electrical conductors contacting the ridge 17 of the gain medium 10. One of the electrical conductors is a doped region 18 of the gain medium 10 that is doped so as to make the doped regions 18 electrically conducting. The doped region 18 also extends into one of the slab regions 16 of the light-transmitting medium 14. The portion of the doped region 18 extending into the lateral side of the gain medium 10 is continuous with the portion of the doped region 18 extending into the slab region 16 of the light-transmitting medium 14. As a result, the doped region 18 provides a continuous electrical pathway from the slab region 16 of the light-transmitting medium 14 to the lateral side of the ridge 17 of gain medium 10.

Another of the electrical conductors is a second doped region 29 of the gain medium 10 that is doped so as to make the second doped region 29 electrically conducting. The second doped region 29 extends into one of the slab regions 16 of the light-transmitting medium 14. The portion of the second doped region 29 extending into the lateral side of the gain medium 10 is continuous with the portion of the second doped region 29 extending into the slab region 16 of the light-transmitting medium 14. As a result, the second doped region 29 provides a continuous electrical pathway from the slab region 16 of the light-transmitting medium 14 to the lateral side of the ridge 17 of gain medium 10.

An electrical contact 28 is in electrical communication with the portion of the doped region 18 located in the slab region 16 of the light-transmitting medium 14. For instance, the electrical contact 28 directly contacts the portion of doped region 18 located in the slab region 16 of the light-transmitting medium 14. Another electrical contact 28 is in electrical communication with the portion of second doped region 29 located in one of the slab regions 16 of the light-transmitting medium 14. For instance, the electrical contact 28 directly contacts the portion of the second doped region 29 located in the slab region 16 of the light-transmitting medium 14.

During operation of the laser, the laser is electrically pumped. For instance, electronics (not shown) apply electrical energy to the electrical contacts 28 such that an electrical current flows from one of the electrical contacts 28 to the other. The electrical current flows through the doped region 18, the gain doped region 26 and the second doped region 29. Since the doped region 18 and the second doped region 29 each extends up a lateral side of the ridge 17 of the gain medium 10, the electrical current flows through the ridge 17 of the gain medium 10. The flow of the electrical current through the gain doped region 26 provides the gain to the laser.

Figure 1F:
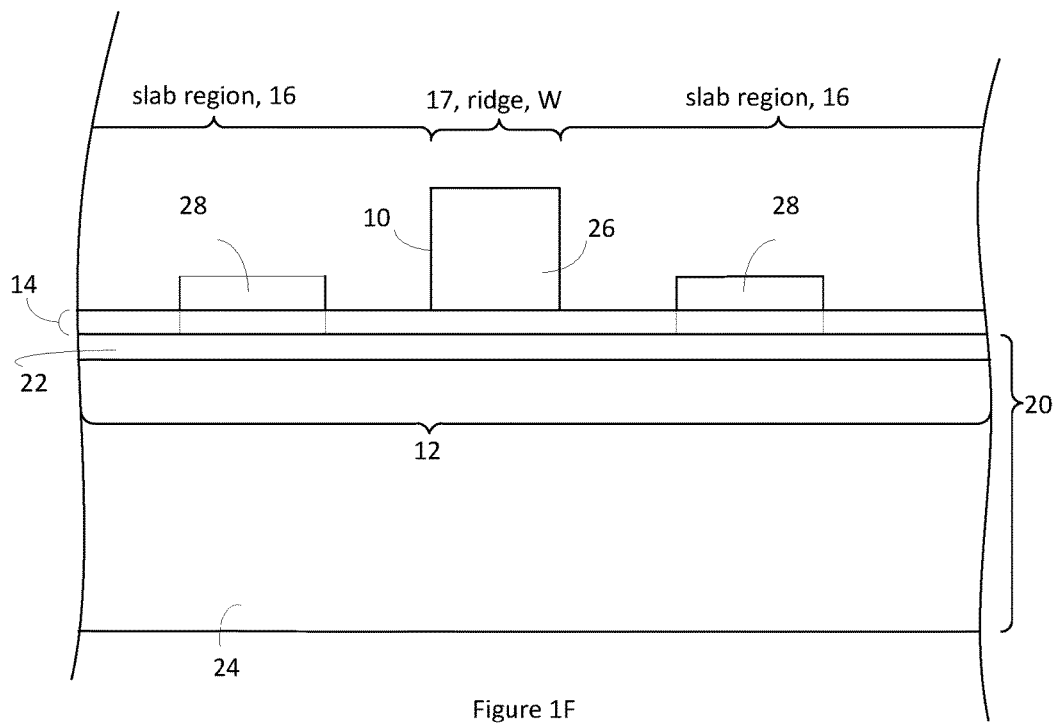

In some instances, the electrical conductors do not extend up the lateral sides of the ridge 17 of the gain medium 10. As an example, FIG. 1F is a cross section of the laser of FIG. 1E adapted such that the electrical conductors do not extend up either lateral side of the ridge 17 of the gain medium 10. Several doped regions 18 are shown in FIG. 1F. The perimeter of the doped regions 18 is illustrated with dashed lines to prevent them from being confused with interfaces between different materials. The interfaces between different materials are illustrated with solid lines.

The laser includes electrical conductors spaced apart from the ridge 17 of the gain medium 10. One of the electrical conductors is a doped region 18 of the gain medium 10 that extends into one of the slab regions 16 of the light-transmitting medium 14. The doped region 18 is doped so as to make the doped region 18 electrically conducting. Another of the electrical conductors is a second doped region 29 of the gain medium 10 that extends into one of the slab regions 16 of the light-transmitting medium 14. The second doped region 29 is doped so as to make the second doped region 29 electrically conducting. The light-transmitting medium 14 also optionally includes a third doped region 30 extending between the doped region 18 and the second doped region 29. FIG. 1F illustrates the gain doped region 26 contacting the third doped region 30. The third doped region 30 is doped so as to provide an electrically conducting pathway under the gain doped region 26.

An electrical contact 28 is in electrical communication with the doped region 18. For instance, the electrical contact 28 directly contacts the doped region 18. Another electrical contact 28 is in electrical communication with the second doped region 29. For instance, the electrical contact 28 directly contacts the second doped region 29.

During operation of the laser, the laser is electrically pumped. For instance, electronics (not shown) apply electrical energy to the electrical contacts 28 such that an electrical current flows from one of the electrical contacts 28 to the other. The electrical current flows through one of the electrical contacts 28, the doped region 18, the third doped region 30, the second doped region 29, and then the other electrical contact 28. When the electrical current has sufficient power, the electrical current enters the ridge 17 of the gain medium 10 through the bottom of the ridge 17 of the gain medium 10. The resulting flow of the electrical current through the gain doped region 26 provides the gain to the laser.

The doped region 18 of FIG. 1D through FIG. 1F and the second doped region 29 of FIG. 1E and FIG. 1F are shown extending part way through the light-transmitting medium 14; however, the doped region 18 and/or second doped region 29 can extend through the light-transmitting medium 14 and into contact with the underlying base 20.

Figure 1G:
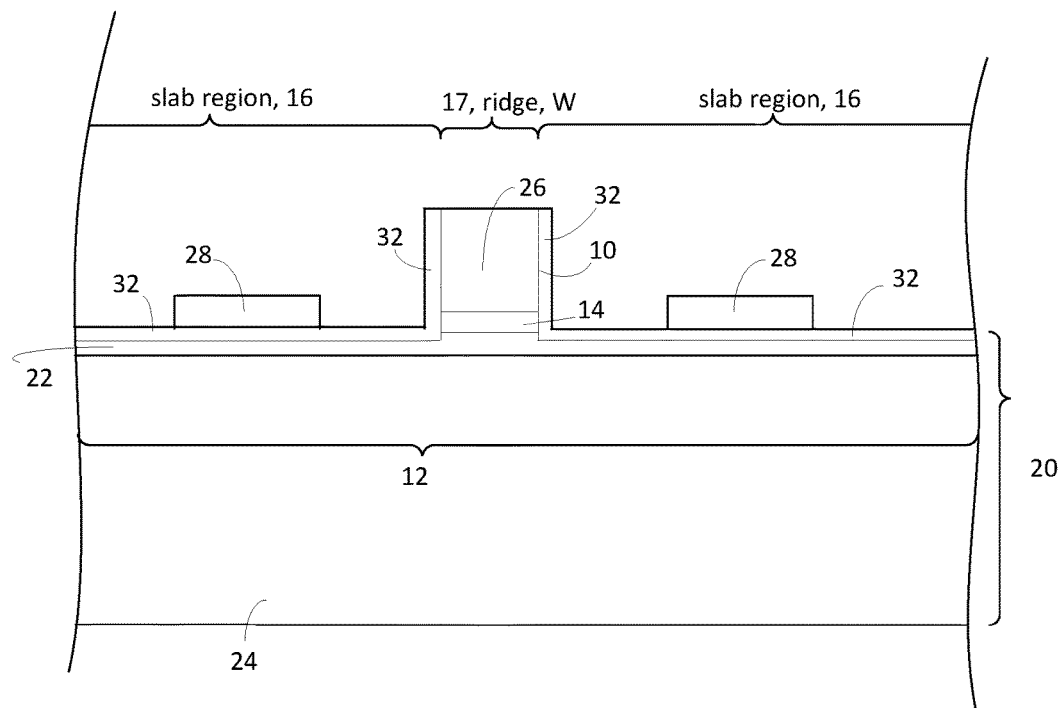

The electrical conductors need not be doped regions 18 of the gain medium 10. FIG. 1G is a cross section of a laser that does not use doped regions 18 of the gain medium 10 as the electrical conductors. The laser includes electrical conductors contacting the ridge 17 of the gain medium 10. For instance, electrical current carriers 32 contact the lateral sides of the ridge 17 on opposing sides of the ridge 17 and serve as the electrical conductors.

A suitable current carrier 32 includes electrically conducting materials such as metals that form a Schottky barrier at the interface of the current carrier 32 and the active medium. However, many of these materials absorb light at undesirably high levels. Another alternative for the current carrier 32 is electrically conducting materials that transmit light at the operational wavelengths but form neither a Schottky barrier at the interface of the current carrier 32 and the gain medium 10 nor a depletion region within the gain medium 10 during the operation of the laser. In these instances, the index of refraction for the current carrier 32 is preferably less than the index of refraction of the active medium in order to reduce or prevent entry of light into the current carrier 32 from the active medium. Examples of these materials may include conducting polymers such as poly(3,4-ethylenedioxythiophene): poly(styrene sulfonate) (PEDOT: PSS).

In another option, a carrier material that transmits light and is doped serves as one or more of the current carriers 32. The carrier material is different from the gain medium 10. In these instances, the index of refraction for the current carrier 32 can be less than the index of refraction of the active medium in order to reduce or prevent entry of light into the current carrier 32 from the active medium. In some instances, the index of refraction of the current carrier 32 is also less than the index of refraction of the light-transmitting medium 14 in order to reduce or prevent entry of light into the current carrier 32 from the gain medium 10. When the gain medium 10 is germanium or $Ge_{1-x}Si_x$ (germanium-silicon) where x is greater than or equal to zero, an example of a suitable carrier material includes, but is not limited to, polysilicon, amorphous silicon, and indium tin oxide.

The doping of the material of the current carrier 32 can make the carrier material electrically conducting and/or increase the electrical current carrying capability of the carrier material. As shown in FIG. 1G, the entire carrier material can be doped and can accordingly serve as the current carrier 32. Alternately, a portion of the carrier material can be doped.

The electrical current carriers each extend onto slab regions 16 of the base 20. Electrical contacts 28 are each in electrical communication with the portion of a current carrier 32 positioned on the slab region 16 of the base 20. For instance, each electrical contact 28 directly contacts the portion of a current carrier 32 located on the slab region 16 of base 20.

During operation of the laser, the laser is electrically pumped. For instance, electronics (not shown) apply electrical energy to the electrical contacts 28 such that an electrical current flows from one of the electrical contacts 28 to the other. The electrical current flows through one of the current carriers 32, the gain doped region 26 and the other current carrier 32. Since the current carriers 32 each extends up a lateral side of the ridge 17 of the gain medium 10, the electrical current flows through the ridge 17 of the gain medium 10. The flow of the electrical current through the gain doped region 26 provides the gain to the laser.

FIG. 1G shows the top of the slab regions 16 being defined by the top of the base 20; however, the electrical current carriers 32 illustrated in FIG. 1G can be used in conjunction with light-transmitting medium 14 and gain medium 10 arranged as is shown in any of FIG. 1A through FIG. 1E. Accordingly, the top of the light-transmitting medium 14 or the gain medium 10 can define the top of the slab regions 16.

The seed portion 12 of the light-transmitting medium 14 labeled in FIG. 1A through FIG. 1G is the portion of the light-transmitting medium 14 upon which the gain medium 10 is grown during the fabrication of the above devices. As will become evident in the discussion of the method for fabricating these devices, the seed portion 12 of the light-transmitting medium 14 may extend beyond the ridge 17 of the gain medium 10 as is shown in the above images such as FIG. 1F and FIG. 1G.

All or a portion of the seed portion 12 of the light-transmitting medium 14 in each laser of FIG. 1A through FIG. 1C, FIG. 1E and FIG. 1G can optionally be doped to include a third doped region 30 as shown by the third doped regions 30 discussed in the context of FIG. 1D and FIG. 1F. For instance, all or a portion of the seed portion 12 of the light-transmitting medium 14 located under and between the electrical contacts 28 can be a doped third region. As an example, an optional third doped region 30 is shown in FIG. 1B. The third doped region 30 doping can increase the electrical conductivity of the portion of the device between the electrical contacts 28 and can accordingly increase the efficiency of the device.

The gain medium 10 can be a material that can be grown on the seed portion 12 of the light-transmitting medium 14. In some instances, the gain medium 10 is an indirect bandgap semiconductor having a crystalline structure. Additionally, in some instances, the lowest energy level conduction band of the gain medium 10 is an indirect bandgap but the next lowest energy level conduction band is a direct bandgap. In some instances, the gain medium 10 includes or consists of one or more group IV materials. In one example, the gain medium 10 includes or consists of one or more group IV materials; can be grown on the seed portion 12 of the light-transmitting medium 14; is an indirect bandgap semiconductor having a crystalline structure; and the lowest energy level conduction band of the gain medium 10 is associated with an indirect bandgap but the next lowest energy level conduction band is associated with a direct bandgap. These materials are typically not used as electrically pumped solid state gain media 10 because the presence of the indirect bandgap causes these materials to generate heat rather than light.

In a laser such as the laser of FIG. 1A through FIG. 1G, stress and doping can be combined so as to permit these materials to act as a gain medium 10. For instance, when the light-transmitting medium 14 is silicon, the gain medium 10 can be germanium or silicon-germanium. In some instances, the silicon-germanium is represented by $Ge_{1-x}Si_x$ where x is greater than or equal to zero and in some instances is less than 0.05, or 0.01. When a semiconductor is grown on another semiconductor, the atoms of the two different materials bond to each other, but do not generally have the same crystal structure. The structure of the grown material tends towards its own normal crystal structure the further you get away from the interface, but there is usually a progressive increase in distortion and defects the closer you get to the interface due to the lattice mismatch. The defects will be mostly in the grown material as this is the one with the energy to change atomic position, while the substrate already has its atoms in place. These features allow the interface between a crystalline material grown on a semiconductor to be distinguished from other types of material interfaces. As a result of this interface, when the mismatch between the lattice structures, due to differences in the lattice packing arrangements of the different materials and/or from differences in the spacing between the atoms in materials having similarly packing arrangements, the semiconductors experience stress. As a result, when a material such as germanium or silicon-germanium is grown on silicon, there is a lattice mismatch that causes the gain medium 10 to be strained. The strain on the gain medium 10 causes the energy difference between the direct and indirect band gaps to be reduced, but the indirect gap is still lower energy and electrons will accordingly tend to occupy these levels. The remaining difference in energy can be compensated by filling this lower energy indirect gap levels by heavy n-doping.

The level of doping in the gain doped region 26 is selected such that the combination of doping and stress causes the lowest energy conduction band to stay filled with electrons during operation of the laser. Because the lowest energy conduction band of these materials is associated with an indirect bandgap, the indirect bandgap remains filled during operation of the laser. Since the lowest energy level conduction band is not available for excited electrons, the electrons are excited into the next lowest energy level conduction band. When next lowest energy level conduction band is associated with a direct band gap, the next lowest energy level conduction band becomes the source of photons in the laser.

While the above description describes the gain medium 10 as having the lowest energy level conduction band associated with an indirect bandgap and the next lowest energy level conduction band as being associated with a direct bandgap, materials where more than one of the lowest energy level conduction bands are each associated with an indirect bandgap can also be used. In these instances, the laser is constructed such that each of the lowest energy level conduction bands that is associated with an indirect bandgap remains filled with electrons during the operation of the laser. As a result, the lowest energy level conduction band that is associated with a direct bandgap becomes the source of photons in the laser.

As noted above, the laser can include one or more doped regions 18. Doping refers to intentionally introducing impurities into a semiconductor for the purpose of modulating its electrical properties. The impurities can be substitutional in that they substitute for other atoms in the crystal structure or interstitial in that they fit between the atoms of an existing crystalline structure. The doping in the doped region 18 and the second region can be degenerate doping that causes the light-transmitting medium 14 and/or gain medium 10 to act more like an electrical conductor than a semiconductor. However, the doping is not to a level that causes formation of a new compound within the semiconductor.

The gain doped region 26 can include an n-type dopant in order to cause the electrons to fill the lowest energy conduction band. As a result, the gain doped region 26 can be an n-type doped region. The doped region 18 can include an n type dopant and can also be an n-type doped region. Any second doped regions 29 can include p-type dopants and can be p-type doped regions. In some instances, the doped region 18 is more heavily doped than the gain doped region 26. For instance, the doped region 18 can include a higher concentration of n-type dopant than the gain doped region 26. In some instances, the doped region 18 and the second doped region 29 are both more heavily doped than the gain doped region 26. For instance, the doped region 18 can include a higher concentration of n-type dopant than the gain doped region 26 and the second doped region 29 can include a higher concentration of p-type dopant than the gain doped region 26. These arrangements allow the doped region 18 and the second doped regions 29 to perform the electrical conduction and contact functions while also permitting the gain medium 10 to have a dopant concentration that moves electrons into the lowest energy conduction band. As noted above, in some instances, the laser includes a third doped region 30 located in the seed portion 12 of the light-transmitting medium 14. The third doped region 30 can include an n-type dopant and can accordingly be an n-type doped region.

The type of dopant can be dependent on the type of semiconductor being doped. When the semiconductor is silicon, germanium, or silicon-germanium, suitable N-type dopants include, but are not limited to, phosphorus and/or arsenic and suitable P-type dopants include, but are not limited to, boron.

A suitable concentration for dopant in the gain doped region 26 includes concentrations greater than $5\times10^{18}$ cm$^{-3}$, $1\times10^{19}$ cm$^{-3}$, or $5\times10^{19}$ cm$^{-3}$, and/or less than $1\times10^{20}$ cm$^{-3}$, $5\times10^{20}$ cm$^{-3}$, or $1\times10^{21}$ cm$^{-3}$. A suitable concentration for dopant in the doped region 18 and/or in the second doped region 29 includes concentrations greater than $5\times10^{19}$ cm$^{-3}$, $1\times10^{20}$ cm$^{-3}$, or $5\times10^{20}$ cm$^{-3}$, and/or less than $1\times10^{21}$ cm$^{-3}$, $5\times10^{21}$ cm$^{-3}$, or $1\times10^{22}$ cm$^{-3}$. A suitable concentration for dopant in the third doped region 30 includes concentrations greater than $5\times10^{18}$ cm$^{-3}$, $1\times10^{19}$ cm$^{-3}$, or $5\times10^{19}$ cm$^{-3}$, and/or less than $1\times10^{20}$ cm$^{-3}$, $5\times10^{20}$ cm$^{-3}$, or $1\times10^{21}$ cm$^{-}$. A suitable concentration for dopant in a current carrier 32 includes concentrations greater than $5\times10^{19}$ cm$^{-3}$, $1\times10^{20}$ cm$^{-3}$, or $5\times10^{20}$ cm$^{-3}$, and/or less than $1\times10^{21}$ cm$^{-3}$, $5\times10^{21}$ cm$^{-3}$, or $1\times10^{22}$ cm$^{-}$.

Figure 2A:
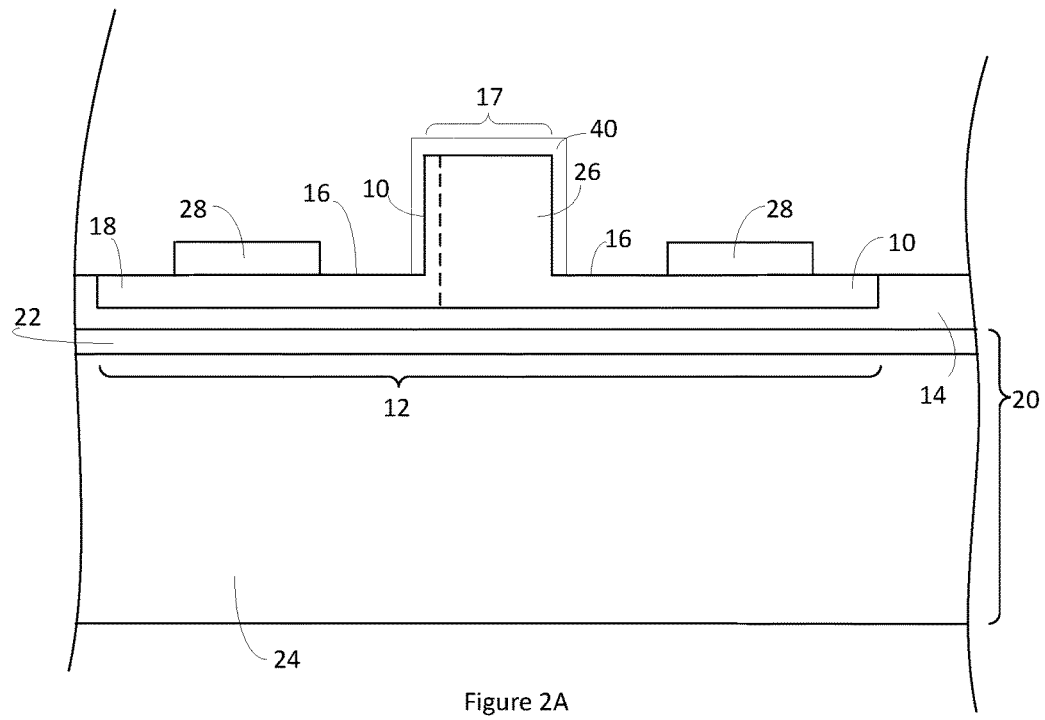
FIG. 2A illustrates a stress-inducing layer formed on the laser of FIG. 1A.
Figure 2B:
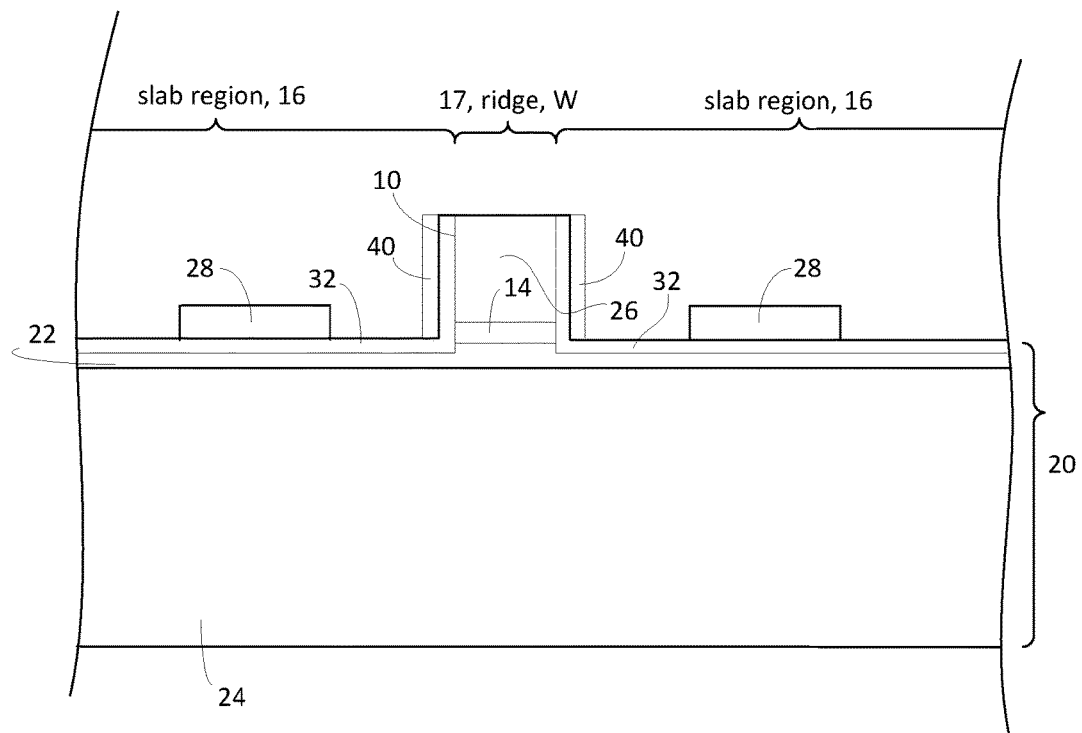
FIG. 2B illustrates a stress-inducing layers formed on the laser of FIG. 1G.

As noted above, the gain medium 10 operates as a source of photons due in part to stress placed on the gain medium 10. The device can include other structures to increase the level of stress on the gain medium 10. For instance, one or more stress-inducing layers 40 can be formed over the gain medium 10 in any of the lasers according to FIG. 1A through FIG. 1G. For instance, FIG. 2A illustrates a stress-inducing layer 40 formed on the gain medium 10 in the laser of FIG. 1A. The stress-inducing layer 40 is positioned over the top and lateral sides of the ridge 17 of gain medium 10;

however, a suitable stress-inducing layer 40 can be positioned over a portion of the ridge 17 of gain medium 10. For instance, FIG. 2B illustrates a stress-inducing layers 40 formed on the lateral sides of a gain medium 10 in the laser of FIG. 1G.

The one or more stress-inducing layers 40 can induce stress after bonding to the [JLI] immediately underlying layer. For instance, when a stress-inducing layer 40 directly contacts the gain medium 10, the stress-inducing layer 40 can induce stress in the gain medium 10. The stress can be a result of growing or depositing the stress-inducing layer 40 on the gain medium 10 using techniques such as CVD, evaporation, and sputtering.

A stress-inducing layer 40 that contacts the gain medium 10 can have a lower index of refraction than the gain medium 10. The drop in index of refraction allows the stress-inducing layer 40 to act as a cladding that confines light signals within the gain medium 10. When the gain medium 10 includes or consists of germanium or silicon-germanium, a suitable material for a stress-inducing layer 40 includes, but is not limited to, silica, silicon nitride, and aluminum oxide.

Figure 3A:
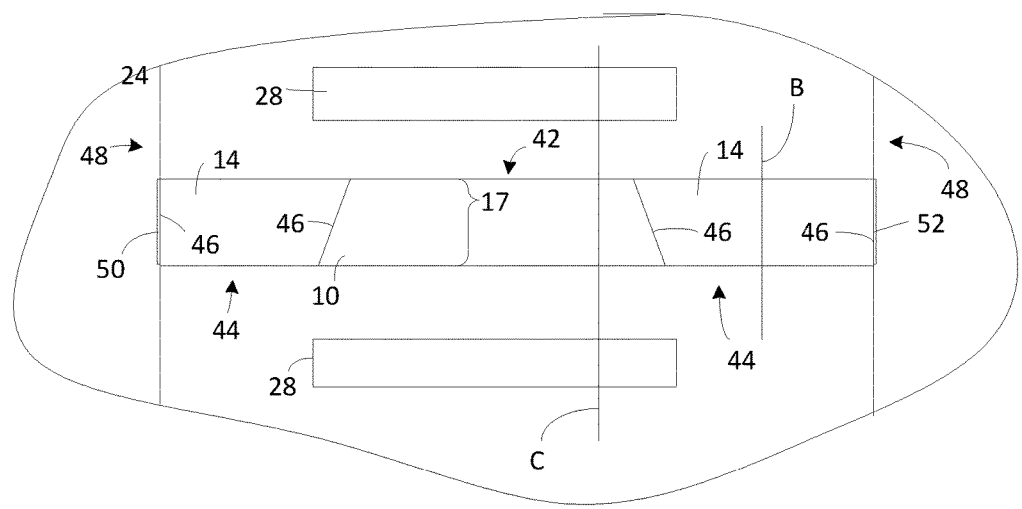
FIG. 3A through FIG. 5 illustrate laser cavities that can each include a laser having a cross section as disclosed in the context of any one of FIG. 1A through FIG. 2B.
Figure 3B:
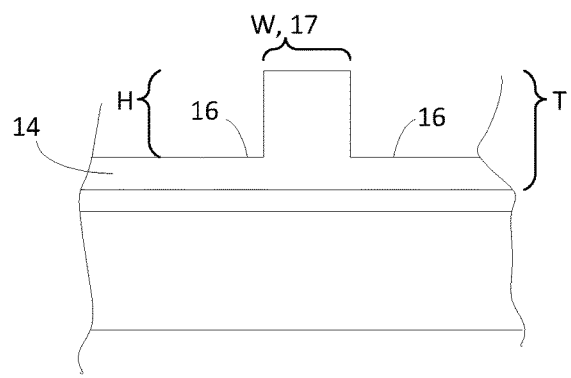

A laser cavity that employs the above lasers can be a Fabry-Perot laser. FIG. 3A through FIG. 4B illustrate a portion of an optical device having a different embodiment of a Fabry-Perot laser cavity. FIG. 3A is a topview of a portion of an optical device having an embodiment of a Fabry-Perot laser cavity. FIG. 3B is a cross section of the device shown in FIG. 3A taken along the line labeled B in FIG. 3A. Any of the lasers disclosed in the context of FIG. 1A through FIG. 2B can represent a cross section of the device taken along the line labeled C in FIG. 3A; however, only the location of the ridge 17 of gain medium 10 and the electrical contacts 28 are illustrated in order to simplify the illustration.

The ridge 17 of the gain medium 10 partially defines a gain waveguide 42 in the laser cavity. The gain waveguide 42 is positioned between cavity waveguides 44 and is optically aligned with the cavity waveguides 44 such that the gain waveguide 42 exchanges light signals with the cavity waveguides 44. The cavity waveguides 44 are partially defined by a ridge 17 of light-transmitting medium 14 extending upwards from slab regions 16 of the light-transmitting medium 14 located on opposing sides of the ridge. The light-transmitting medium 14 included in the ridge 17 of the cavity waveguides 44 can be continuous with the seed portion 12 of the light-transmitting medium 14 positioned under the gain medium 10 in each of FIG. 1A through FIG. 2B. Additionally or alternately, the light-transmitting medium 14 included in the ridge 17 of the component waveguides 62 (discussed below) can be continuous with the seed portion 12 of the light-transmitting medium 14.

The portion of the base 20 adjacent to the light-transmitting medium 14 is configured to reflect light signals being guided in the ridge 17 back into the ridge 17 in order to constrain light signals in the cavity waveguide 44 and in the gain waveguide 42. For instance, the portion of the base 20 adjacent to the light-transmitting medium 14 can be an optical insulator 22 with a lower index of refraction than the light-transmitting medium 14. The drop in the index of refraction can cause reflection of a light signal from the light-transmitting medium 14 back into the light-transmitting medium 14 and the gain medium 10.

As noted above, the device can be constructed on a silicon-on-insulator 22 wafer. A silicon-on-insulator 22 wafer includes a silicon layer positioned on a base 20 having a layer of silica positioned on a silicon substrate. The layer of silicon serves as the light-transmitting medium 14 and the silica serves as the optical insulator 22 that confines the light signal within the gain waveguide 42 and the cavity waveguide 44.

As is evident from FIG. 3A, the gain waveguide 42 has an interface with each of the cavity waveguides 44. The interface can be angled at less than 90° relative to the direction of propagation of light signals through the gain waveguide 42 at the interface. Angling the interface at less than 90° can reduce the effects of back reflection at the interface.

The cavity waveguides 44 end at facets 46 that are positioned at or near an edge 48 of the device. The facets 46 can be formed as a result of cleaving the device from a wafer and can be polished. The device also includes a high return component configured to receive a light signal from one of the cavity waveguides 44. The high return component is configured to return all or substantially all of the received light signal to the cavity waveguide 44 from which it originated. A suitable high return component includes, but is not limited to, a reflective grating such as a Bragg grating and a highly reflective coating 50 over the facet 46. A suitable coating for serving as the high return component includes a highly reflective coating 50. Suitable highly reflective coatings 50 include, but are not limited to, metals or multilayer coatings of high and low index dielectric materials such as titanium dioxide and silicon dioxide.

The device also includes a partial return component configured to receive a light signal from one of the cavity waveguides 44. The partial return component is configured to return a portion of the received light signal to the cavity waveguide 44 from which it originated and to output another portion of the received light as output from the laser. A suitable partial return component includes, but is not limited to, reflective gratings such as a Bragg grating and a partially reflective coating 52 positioned over the facet 46. A suitable coating for serving as the partial return component includes a partially reflective coating 52. Suitable partially reflective coatings 52 include, but are not limited to, single layer dielectrics or multilayer coatings of high and low index dielectrics such as titanium dioxide and silica.

During operation of the laser, the light signal resonates between the partial return component and the high return component. As a result, the partial return component and the high return component define the laser cavity. Since the cavity waveguides 44 and the gain waveguide 42 carry the light signal between the partial return component and the high return component, the cavity waveguides 44 and the gain waveguide 42 make up and act as a laser waveguide.

Multiple passes of the light signal through the gain medium 10 amplify the light signal before the light signal exits the laser cavity as laser output.

Figure 3C:
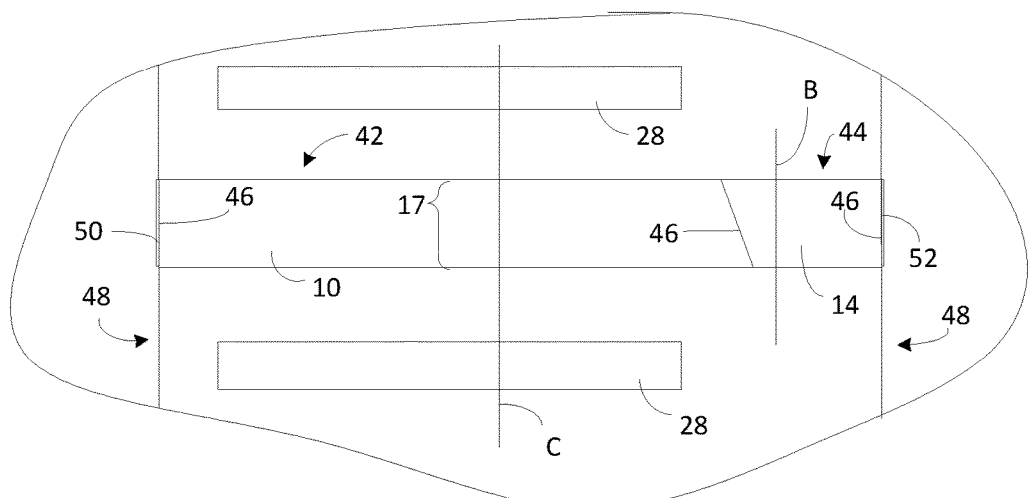

A laser cavity having the above lasers can include a single cavity waveguide 44. For instance, FIG. 3C illustrates a laser cavity that includes a single cavity waveguide 44 aligned with a gain waveguide 42 such that the gain waveguide 42 exchanges light signals with the cavity waveguide 44. FIG. 3C is a topview of a portion of an optical device having an embodiment of a Fabry-Perot laser cavity. In some instances, FIG. 3B represents a cross section of the device shown in FIG. 3C taken along the line labeled. Any of the lasers disclosed in the context of FIG. 1A through FIG. 2B can represent a cross section of the device taken along the line labeled C in FIG. 3C; however, only the location of the ridge 17 of the gain medium 10 and the electrical contacts 28 are illustrated in order to simplify the illustration.

The device includes a cavity waveguide 44 constructed as discussed in the context of FIG. 3A and FIG. 3B. The cavity waveguide 44 is interfaced with a gain waveguide 42 as discussed in the context of FIG. 3A. Accordingly, the ridge 17 of the gain medium 10 defines a portion of the gain waveguide 42 and the cavity waveguide 44 has a cross section in accordance with FIG. 3B.

The cavity waveguide 44 ends at a facet 46 positioned at or near an edge 48 of the device. Additionally, the gain waveguide 42 ends at facet 46 positioned at or near an edge 48 of the device. The facets 46 can be formed as a result of cleaving the device from a wafer and can be polished. The device includes a high return component configured to receive a light signal from one of the cavity waveguide 44. The high return component is configured to return all or substantially all of the received light signal to the cavity waveguide 44. A suitable high return component includes a highly reflective coating 50 positioned on one of the facets 46. Suitable highly reflective coatings 50 include, but are not limited to, metals or multilayer coatings of high and low index dielectric materials such as titanium dioxide and silicon dioxide.

The device also includes a partial return component configured to receive a light signal from the gain waveguide 42. The partial return component is configured to return a portion of the received light signal to the gain waveguide 42 and to output another portion of the received light as output from the laser. A suitable high return component includes a partially reflective coating 52 positioned on the facets 46 of the gain waveguide 42. Suitable partially reflective coatings 52 include, but are not limited to, single layer dielectrics or multilayer coatings of high and low index dielectrics such as titanium dioxide and silica.

During operation of the laser, the light signal resonates between the partial return component and the high return component. As a result, the partial return component and the high return component define the laser cavity. Since the cavity waveguide 44 and the gain waveguide 42 carry the light signal between the partial return component and the high return component, the cavity waveguide 44 and the gain waveguide 42 together make up and act as a laser waveguide. Multiple passes of the light signal through the gain medium 10 amplify the light signal before the light signal exits the laser cavity as output.

Although FIG. 3C illustrates the high return component receiving the light signal from the cavity waveguide 44 and the partial return component receiving the light signal from the gain waveguide 42, the positions of the return devices can be reversed. For instance, the partial return component can receive the light signal from the cavity waveguide 44 and the high return component receiving the light signal from the gain waveguide 42.

Figure 3D:
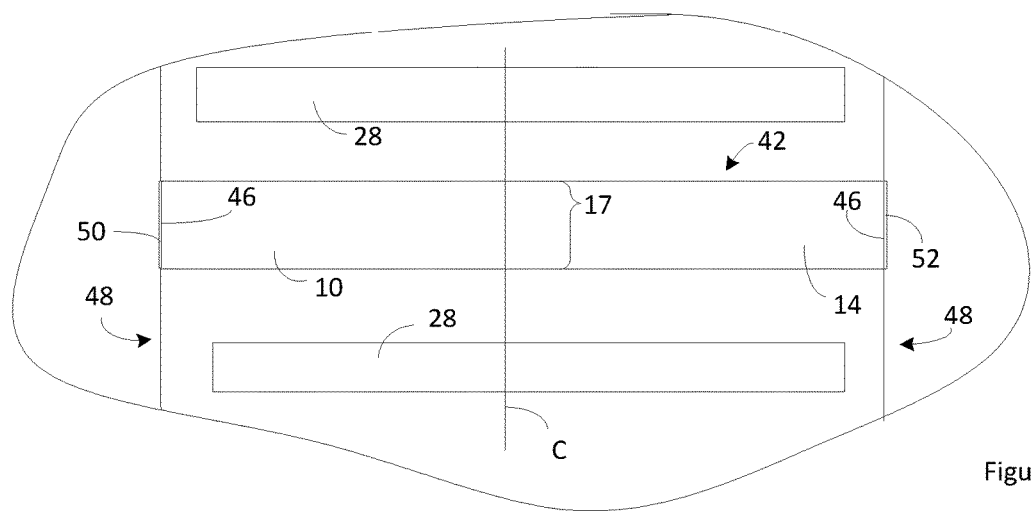

A laser cavity having the above lasers can exclude cavity waveguides 44. For instance, FIG. 3D illustrates a laser cavity that includes a gain waveguide 42 that serves as a laser waveguide. FIG. 3D is a topview of a portion of an optical device having an embodiment of a Fabry-Perot laser cavity. Any of the lasers disclosed in the context of FIG. 1A through FIG. 2B can represent a cross section of the device taken along the line labeled C in FIG. 3D; however, only the location of the ridge 17 of gain medium 10 and the electrical contacts 28 are illustrated in order to simplify the illustration.

The ridge 17 of the gain medium 10 at least partially defines a gain waveguide 42 on the device. The gain waveguide 42 ends at facets 46 that are each positioned at or near an edge 48 of the device. The facets 46 can be formed as a result of cleaving the device from a wafer and can be polished. The device includes a high return component configured to receive a light signal from the gain waveguide 42. The high return component is configured to return all or substantially all of the received light signal to the gain waveguide 42. A suitable high return component includes a highly reflective coating 50 positioned on one of the facets 46. Suitable highly reflective coatings 50 include, but are not limited to, metals or multilayer coatings of high and low index dielectric materials such as titanium dioxide and silicon dioxide.

The device also includes a partial return component configured to receive a light signal from the gain waveguide 42. The partial return component is configured to return a portion of the received light signal to the gain waveguide 42 and to output another portion of the received light as output from the laser. A suitable high return component includes a partially reflective coating 52 positioned on the facets 46 of the gain waveguide 42. Suitable partially reflective coatings 52 include, but are not limited to, single layer dielectrics or multilayer coatings of high and low index dielectrics such as titanium dioxide and silica.

During operation of the laser, the light signal resonates between the partial return component and the high return component. As a result, the partial return component and the high return component define the laser cavity. Since the gain waveguide 42 carries the light signal between the partial return component and the high return component, the gain waveguide 42 makes up and acts as a laser waveguide. Multiple passes of the light signal through the gain medium 10 amplify the light signal before the light signal exits the laser cavity as output.

Figure 4A:
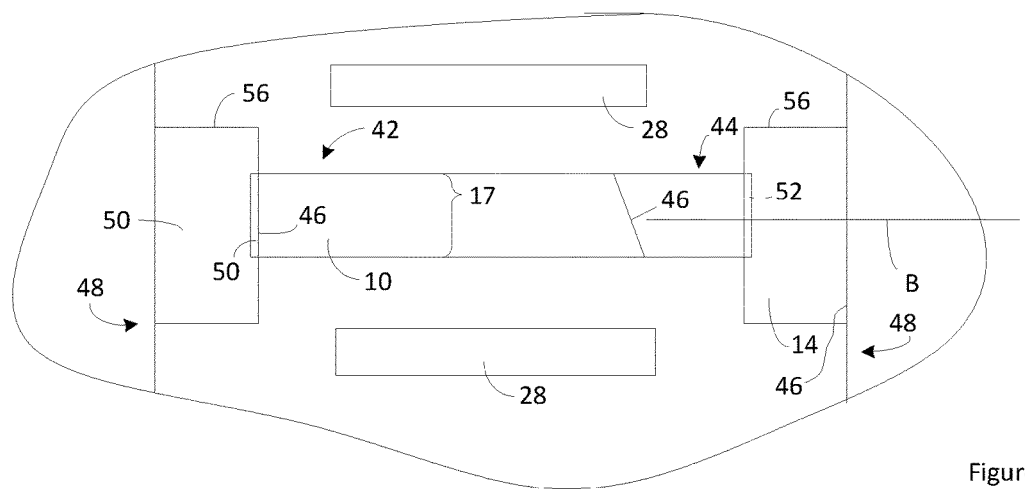
Figure 4B:
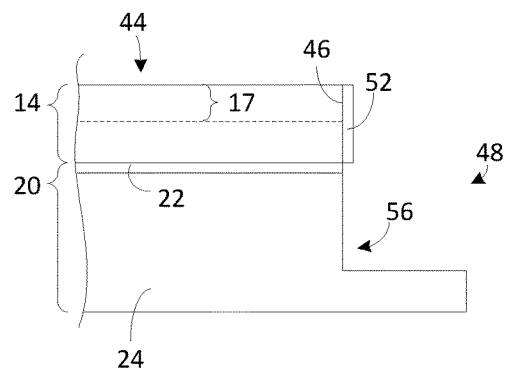

The facets 46 shown in FIG. 3A through FIG. 3D need not be formed as a result of cleaving. For instance, one or both facets 46 in any of the above laser cavities can be polished or etched. As an example, FIG. 4A and FIG. 4B illustrate the device of FIG. 3C but with each of the facets 46 formed as a result of etching. FIG. 4A is a topview of a portion of an optical device having an embodiment of a Fabry-Perot laser cavity. FIG. 4B is a cross section of the device shown in FIG. 4A taken along the line labeled B in FIG. 4A.

A facet recess 56 is located at the end of the cavity waveguide 44. As is evident in FIG. 4B, the facet recess 56 extends through the light-transmitting medium 14. As a result, a side of the facet recess 56 serves as the facet 46 of the cavity waveguide 44. Although the facet recess 56 is shown extending into the base 20, the facet recess 56 can extend only down to the base 20.

Another facet recess 56 is located at the end of the gain waveguide 42. The facet recess 56 extends through the gain medium 10 and the underlying light-transmitting medium 14. As a result, a side of the facet recess 56 serves as the facet 46 of the gain waveguide 42. Although the facet recess 56 is shown extending into the base 20, the facet recess 56 can extend only down to the base 20 or only down to the light-transmitting medium 14 between the gain medium 10 and the base 20.

Since etching the device can form the facet recess 56, the facets 46 can also be formed as a result of etching the device. Formation of the facet 46 by etching can eliminate the need to polish the facets 46 as is often required when the facets 46 are formed as part of dicing or cleaving the device from a wafer.

Although FIG. 4A and FIG. 4B illustrates the high return component receiving the light signal from the cavity waveguide 44 and the partial return component receiving the light signal from the gain waveguide 42, the positions of the return devices can be reversed. For instance, the partial return component can receive the light signal from the cavity waveguide 44 and the high return component receiving the light signal from the gain waveguide 42.

Although FIG. 4A illustrates both facets 46 being formed by etching, one of the facets 46 can be formed by etching while another of the facers can be formed as a result of cleaving and polishing.

One or more of the waveguides in the laser cavity can be tapered. For instance, the device of FIG. 3A through FIG. 4B can include one or more taper in the laser waveguide. The one or more tapers can each be a vertical taper and/or a horizontal taper. The one or more tapers can be adiabatic tapers. In some instances, the laser waveguide includes one or more horizontal taper and excludes vertical tapers.

Figure 5:
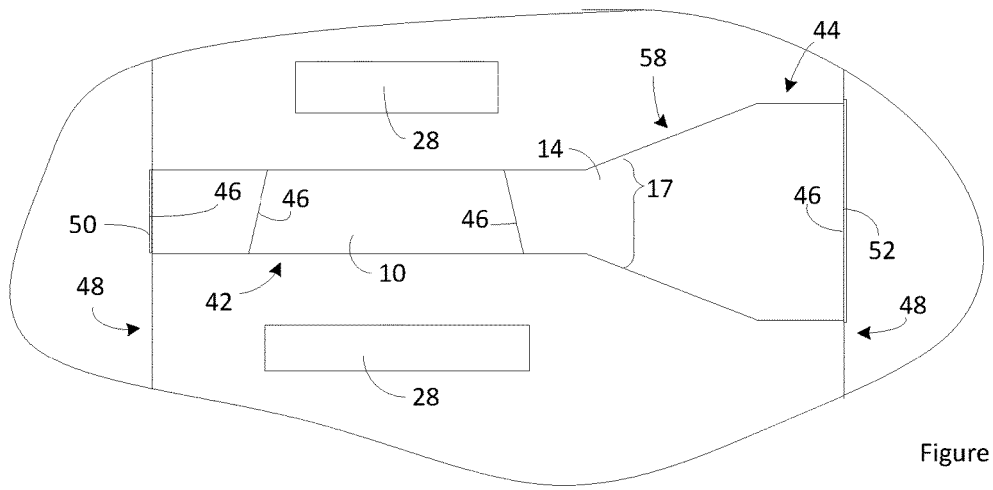

A taper can permit the laser cavity to be directly interfaced with waveguides that have different dimensions that the portion of the gain waveguide 42 where gain is achieved. As an example, FIG. 5 is a topview of a device having a laser cavity constructed according to FIG. 3A and with one of the cavity waveguides 44 including a horizontal taper 58 and the laser waveguide excluding vertical tapers. The cavity waveguide 44 that includes the horizontal taper 58 terminates at a facet 46 that includes the partial return component. As a result, the output of the laser cavity exits the laser cavity through the facet 46 of the tapered cavity waveguide 44. The use of the taper 58 allows the output to have the appropriate dimensions for the light signal to be received by another device. For instance, optical fibers can receive the output from the device. However, optical fibers typically have larger dimensions than the waveguides of planar optical device. The taper allows the mode of the light signal output by the device to be expanded to the proper dimensions of the optical fiber or other waveguide, component, or device.

Designing the laser so the electrical current flows from a slab region 16 on one side of the ridge 17 of gain medium 10 to the other side of the ridge 17 of gain medium 10 allows the efficiency of the lasers to be optimized while still permitting the lasers to be used with a broad range of devices. The width of the ridge 17 of gain medium 10 is labeled w in FIG. 1A. Reducing the width of the ridge 17 of gain medium 10 can increase the efficiency of the laser by reducing the amount of power that is required to generate output of a particular intensity. As a result, it is often desirable for the gain medium 10 to have a width of about 1 µm or less than 1 µm. However, other devices that receive the output from the laser cavity often have larger dimensions. For instance, optical fibers typically have a core with a diameter greater than 9 µm and waveguides of planar optical devices often have a width greater than 9 µm. The output of the laser cavity can be easily matched to the dimensions that are desired by these devices. For instance, a horizontal taper can be used to expand the output of the laser cavity to the desired width while still allowing the active region of the laser to have the narrower width needed to achieve the required level of efficiency. At the same time, the thickness of the gain waveguide 42 and the cavity waveguides 44 (labeled t in FIG. 1A and FIG. 3B) can be configured such that the output of the laser cavity has the desired thickness. As a result, the output of the laser cavity has both the desired height and thickness without the use of vertical tapers. Contrast this result with placement of the electrical conductors above and below the gain medium 10. In this case, it would be desirable to reduce the thickness of the gain medium 10 in the active region of the laser in order to achieve the desired efficiency of the laser. As a result, matching the output dimensions to other devices would likely require a vertical taper and/or lens arrangement. However, vertical tapers and lenses are difficult to fabricate in planar optical devices and can accordingly increase the cost and complexity of these devices. In contrast, horizontal tapers are easily achieved through photolithography and etching. Since the electrical current flows between slab regions 16 on opposing sides of the ridge 17 of gain medium 10, the dimension of the output can be matched to other devices through the use of only horizontal tapers. As a result, the disclosed pattern of electrical current flow can reduce the cost and complexity of the device while allowing the efficiency of the laser to be retained. In particular, the disclosed patterns of electrical current flow can be achieved by driving the electrical current through the lateral sides of the ridge. As a result, the placement of electrical conductors on one or more sides of the ridge 17 also allows these features to be achieved efficiently.

Figure 6A:
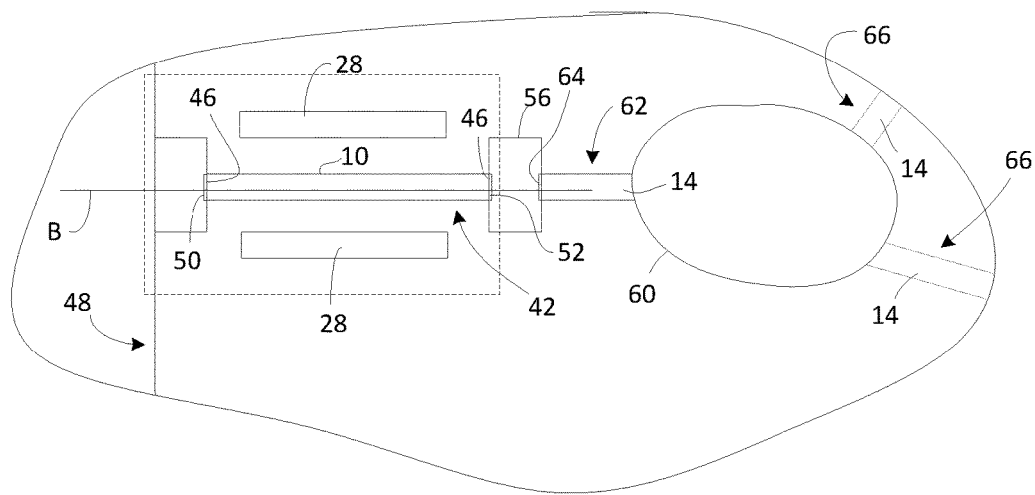
FIG. 6A and FIG. 6B illustrate a device that includes one of the above laser cavities in combination with one or more other optical components.
Figure 6B:
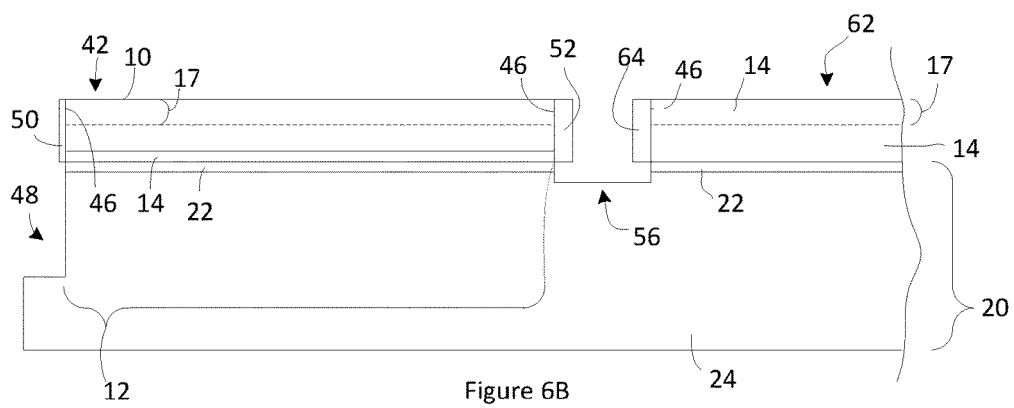

The above lasers and laser cavities are easily integrated into a device that includes other optical components. For instance, FIG. 6A and FIG. 6B illustrate a device that includes one of the above laser cavities in combination with one or more other optical components 60. The laser cavity illustrated in FIG. 6A and FIG. 6B is a laser cavity constructed according to FIG. 3D but with both facets 46 formed by etching as disclosed in the context of FIG. 4A and FIG. 4B. FIG. 6A is a topview of a portion of the device and FIG. 6B is a cross section of the device taken along the line labeled B in FIG. 6A. The dashed line in FIG. 6A surrounds the location of the laser cavity on the device but does not show any structural feature of the device.

The device includes a component waveguide 62 that carries the light signal output from the laser cavity to and/or from an optical component 60. The component waveguide 62 can be partially defined by a ridge 17 of light-transmitting medium 14 and can accordingly have a cross section according to FIG. 3B. For instance, the cross section shown in FIG. 3B can represent the cross section of the component waveguide 62.

The component waveguide 62 includes a facet 46 aligned with a facet 46 of the laser cavity such that the component waveguides 62 receives the output of the laser cavity. A facet recess 56 is located between the end of the cavity component waveguide 62 and the end of the laser cavity. As is evident in FIG. 6B, the facet recess 56 extends through the light-transmitting medium 14. As a result, a side of the facet recess 56 serves as the facet 46 of the cavity waveguide 44 and as a facet 46 on the laser cavity. Although the facet recess 56 is shown extending into the base 20, the facet recess 56 can extend only down to the base 20.

The component waveguide 62 includes an anti-reflective coating 64 to reduce reflection of the laser output by the facet 46 of the component waveguide 62. The output from the laser cavity enters the component waveguide 62 through the anti-reflective coating 64. A suitable anti-reflective coating 64 includes, but is not limited to, single-layer coatings such as silicon nitride or aluminum oxide, or multilayer coatings, which may contain silicon nitride, aluminum oxide, and/or silica.

The component 60 can output light signal to other components and/or locations on the device and/or receive light signals from other components and/or locations on the device. Accordingly, the component 60 is illustrated as being optically coupled with two auxiliary waveguides 66. Depending on the function of the component 60, the component 60 can be optically coupled with more than two auxiliary waveguides 66 or less than two auxiliary waveguides 66. In some instance, the component 60 does not exchange light signals with other components and/or locations on the device and accordingly is not optically coupled with any other auxiliary waveguides 66.

Although FIG. 6A and FIG. 6B illustrate the laser cavity of FIG. 3D integrated into the device, any of the above laser cavities can be integrated into the device of FIG. 6A and FIG. 6B.

Figure 7:
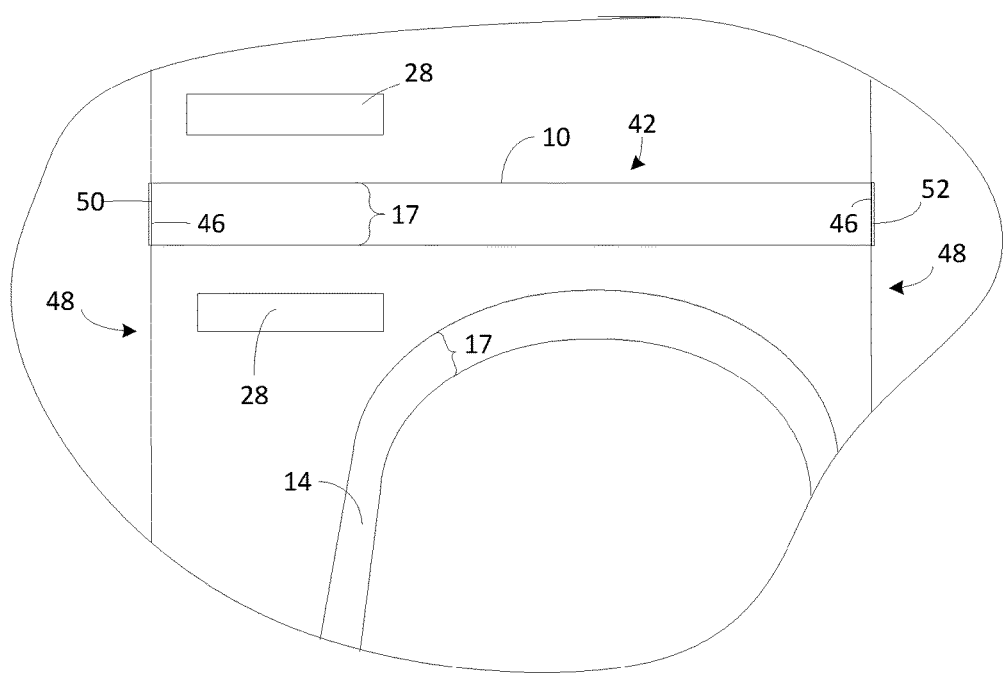
FIG. 7 illustrates a device that includes a component waveguide optically coupled with a laser integrated onto the device.

In the device of FIG. 6A and FIG. 6B, the output of the laser cavity is coupled into the component waveguide 62 by alignment of the facets 46; however, other approaches to coupling the output into a component waveguide 62 can be employed. For instance, the component waveguide 62 can be positioned sufficiently close to the laser waveguide that the output of the laser cavity is optically coupled into the component waveguide 62. FIG. 7 is a topview of a device that provides an example of such an arrangement. FIG. 7 includes a laser cavity constructed according to FIG. 3D although any of the above laser cavities can be employed as disclosed in the context of FIG. 7. When the gain waveguide 42 is constructed according to any of FIG. 1A through FIG. 2B and any component waveguide 62(s) are constructed according to FIG. 3B, the light signal resonating in the laser cavity can be optically coupled into the component waveguide 62 as a result of the component waveguide 62 approaching the laser waveguide. For instance, optical coupling between the laser waveguide and the component waveguide 62 can be achieved when the separation between the ridge 17 of the component waveguide 62 and the ridge 17 of the laser waveguide is on the order of 0.1 µm. An increased degree of coupling can be achieved by further reducing separation between the ridge 17 of the component waveguide 62 and the ridge 17 of the laser waveguide.

Although not shown in FIG. 7, the component waveguide 62 can carry the light signal received from the laser cavity to one or more other optical components positioned on the device as is disclosed in the context of FIG. 6A and FIG. 6B. The component waveguide 62 can carry the light signal away from the laser cavity in either or both directions.

The above laser cavities are shown as using coatings as the high return component and the partial return component; however, other devices can be used to provide the function of the high return component and/or the partial return component. For instance, in any of the above laser cavities, the partial return component can be replaced with a wavelength selective return device such as a reflective grating. A reflective grating transmits a portion of an incident light signal and reflects another portion of the incident light signal. An example of a suitable reflective grating is a Bragg grating. A Bragg grating reflects different wavelengths of light at different intensities and does not reflect 100% of any wavelength. As a result, the wavelengths that are substantially returned to the laser cavity amplify and are then output from the laser cavity as the output. In contrast, the wavelengths that are about 100% transmitted by the Bragg grating are not returned to the laser cavity and are not output. Accordingly, these wavelengths are not amplified and are not substantially present in the output light signal. As a result, the wavelengths that the Bragg grating reflects more strongly have a higher intensity level in the output light signal.

Figure 8A:
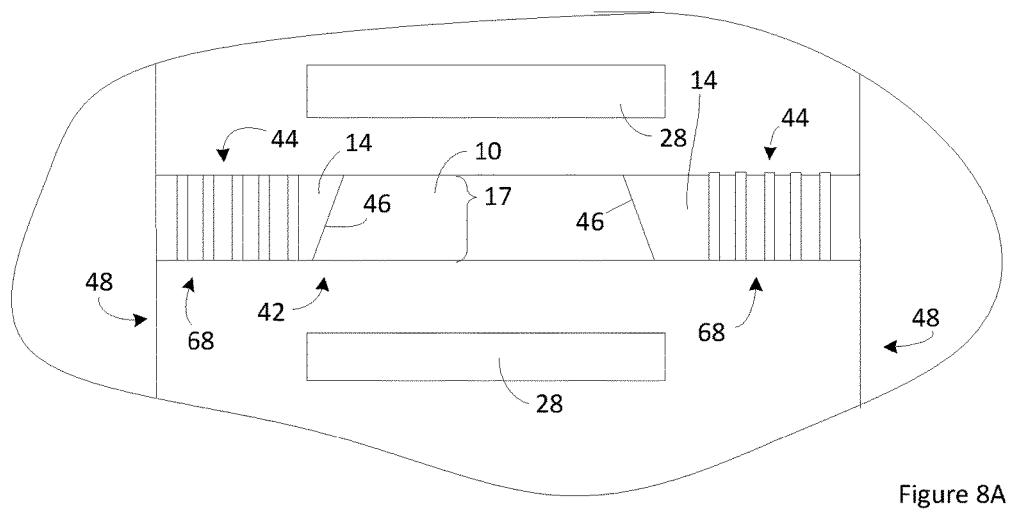
FIG. 8A through FIG. 8C are each a topview of a laser cavity constructed according to one of FIG. 3A through FIG. 3C using Bragg gratings to provide a DBR laser.
Figure 8B:
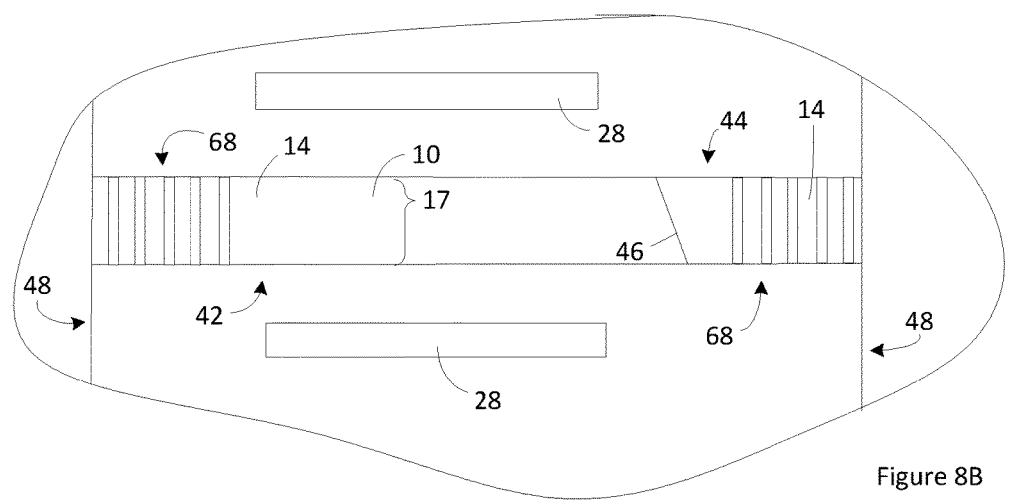

A reflective grating can also be employed to convert the above laser cavities to a distributed Bragg reflector (DBR) laser that provides a more wavelength selective laser output. For instance, a wavelength selective return device such as a reflective grating can serve as both the high return component and the partial return component. In one example, both the highly reflective coating 50 and the partially reflective coating 52 are replaced with a Bragg grating. For instance, FIG. 8A is a topview of a laser cavity constructed according to FIG. 3A where the high return component and the partial return component are both replaced with a Bragg grating in order to provide a DBR laser. As another example, FIG. 8B is a topview of a laser cavity constructed according to FIG. 3C where the high return component and the partial return component are both replaced with a Bragg grating in order to provide a DBR laser. As another example, FIG. 8C is a topview of a laser cavity constructed according to FIG. 3D where the high return component and the partial return component are both replaced with a Bragg grating in order to provide a DBR laser.

The Bragg gratings included in a single laser cavity can each be configured to reflect the same wavelength. In some instances, the Bragg gratings are configured to reflect the same wavelength but one of the Bragg gratings is configured to reflect a higher percentage of light at that wavelength than the other Bragg grating. As a result, one of the Bragg gratings can serve as the high return component and the other can serve as the partial return component.

Figure 8C:
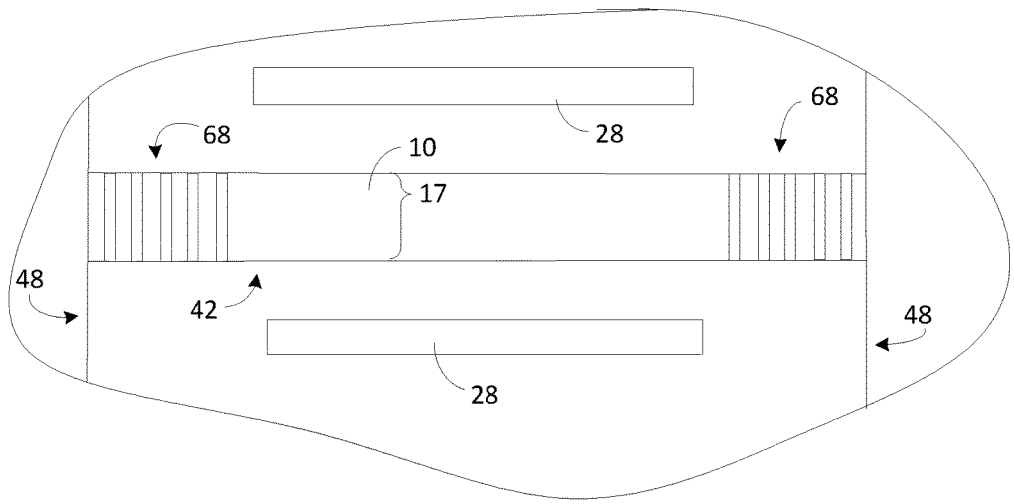

Although FIG. 8A through FIG. 8C illustrate the use of reflective gratings in the laser cavities of FIG. 3A through FIG. 3C, the reflective gratings can be used to define the laser cavity in any of the above laser cavities. Although FIG. 8A through FIG. 8C illustrate the use of reflective gratings to define the laser cavity, any of the above laser cavities can include both a reflective grating and a coating that define the laser cavity.

Figure 8D:
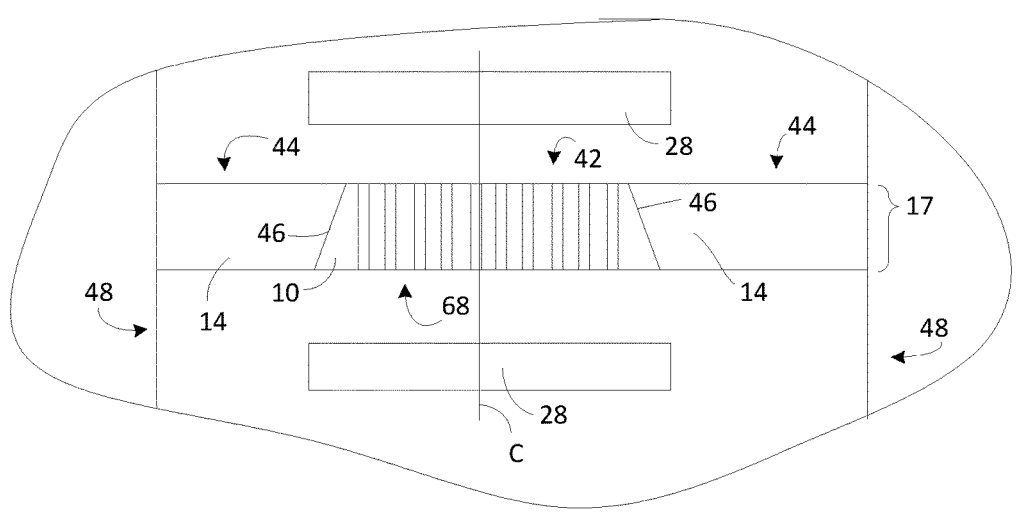
FIG. 8D is a topview of a laser cavity constructed using a Bragg gratings to provide a DFB laser.

In general, the reflective gratings in the DBR laser cavities are positioned outside of the active region of the laser as is shown in FIG. 8A through FIG. 8C. However, one or more reflective gratings can be placed in the active regions of the above laser cavities to provide a distributed feedback (DFB) laser. For instance, FIG. 8D is a topview of a laser cavity where a Bragg grating is located in the active region of the laser. Any of FIG. 1A through FIG. 2B can represent the cross section of the laser cavity taken along the line labeled C in FIG. 8D. In this instance, the resonance occurs within the Bragg grating itself. As a result, the ends of the Bragg grating define the ends of the laser cavity. Additionally, the output of the laser can be from both ends of the Bragg grating. Alternately, the configuration of the Bragg grating can change along the length of the Bragg grating such that the output from the laser cavity is more intense from one end of the Bragg grating than from the other.

Figure 8E:
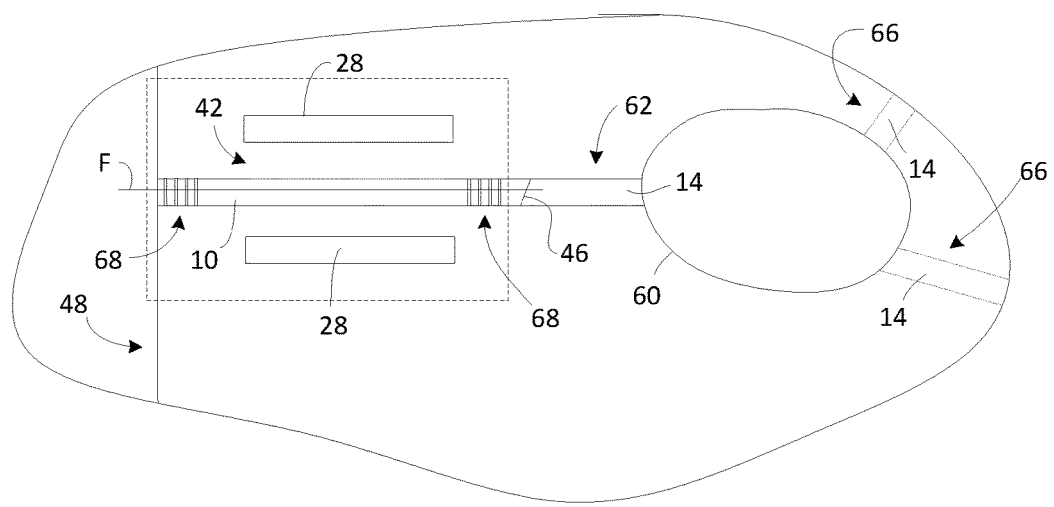
FIG. 8E through FIG. 8G illustrate a device that includes the laser cavity of FIG. 8C configured to exchange a light signal with one or more other optical components.
Figure 8F:
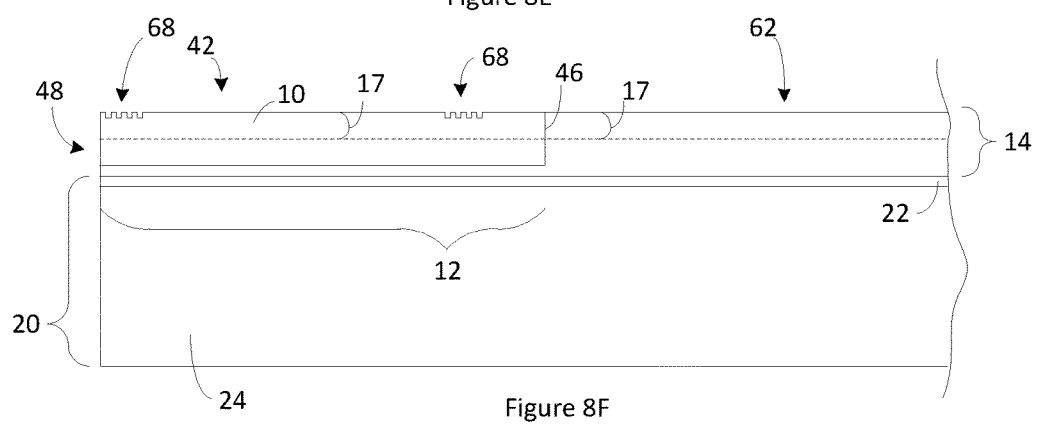

The use of reflective gratings can eliminate the need for a facet recess 56 when the above laser cavity is integrated into a device that includes other optical components 60. For instance, FIG. 8E and FIG. 8F illustrate a device that includes one of the above laser cavities configured to exchange a light signal with one or more other optical components 60. The laser cavity illustrated in FIG. 8E and FIG. 8F is a laser cavity constructed according to FIG. 8C. FIG. 8E is a topview of a portion of the device and FIG. 8F is a cross section of the device taken along the line labeled F in FIG. 8E. The dashed line in FIG. 8E surrounds the location of the laser cavity on the device but does not show any structural feature of the device.

As is evident in FIG. 8F, the light-transmitting medium 14 included in the ridge 17 of the component waveguide 62 is continuous with the seed portion 12 of the light-transmitting medium 14 positioned under the gain medium 10.

Since the laser cavity of FIGS. 8C and 8E has the high return component (Bragg grating) and the partial return component (Bragg grating) both formed in the gain medium 10, the interface between the facet 46 of the gain medium 10 and the facet 46 of the light-transmitting medium 14 occurs outside of the laser cavity. Since a reflective grating is used as the partial return device, coatings need not be present between facet 46 of the gain medium 10 and the facet 46 of the light-transmitting medium 14. As a result, the interface can be a direct interface where the facet 46 of the gain medium 10 contacts the fact of the light-transmitting medium 14. Accordingly, the facet recess 56 need not be formed between the component waveguide 62 and the gain waveguide 42 as shown in FIG. 6A. The interface between facet 46 of the gain medium 10 and the facet 46 of the light-transmitting medium 14 can be angled at less than 90° relative to the direction of propagation of light signals through the gain waveguide 42 at the interface. Angling the interface at less than 90° can reduce the effects of back reflection at the interface.

Figure 8G:
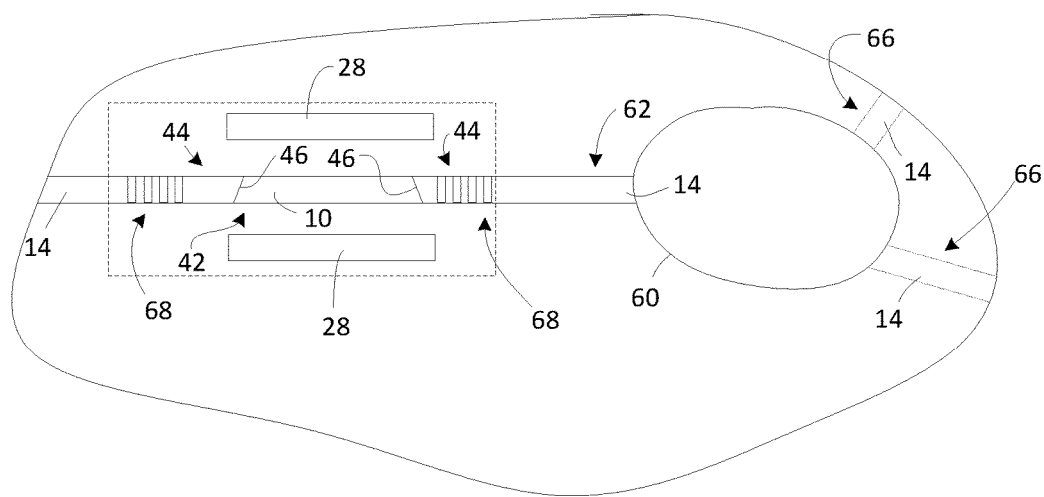

The interface between the facet 46 of the gain medium 10 and the facet 46 of the light-transmitting medium 14 can occur inside of the laser cavity. For instance, FIG. 8G illustrates a device that includes one of the above laser cavities configured to exchange a light signal with one or more other optical components 60 on the device. The laser cavity illustrated in FIG. 8G is a laser cavity constructed according to FIG. 8A. FIG. 8E is a topview of a portion of the device. The dashed line in FIG. 8G surrounds the location of the laser cavity on the device but does not show any structural feature of the device. The interface between facet 46 of the gain medium 10 and the facet 46 of the light-transmitting medium 14 can be angled at less than 90° relative to the direction of propagation of light signals through the gain waveguide 42 at the interface. Angling the interface at less than 90° can reduce the effects of back reflection at the interface.

Although FIG. 8E and FIG. 8G illustrate the laser cavities of FIG. 8A and FIG. 8C integrated into the device, any of the above laser cavities can be integrated into the device of FIG. 8E through FIG. 8G. For instance, the laser waveguide can include a taper in order to match the dimensions of the mode output by the laser cavity to the dimensions of the component waveguide 62.

Figure 8H:
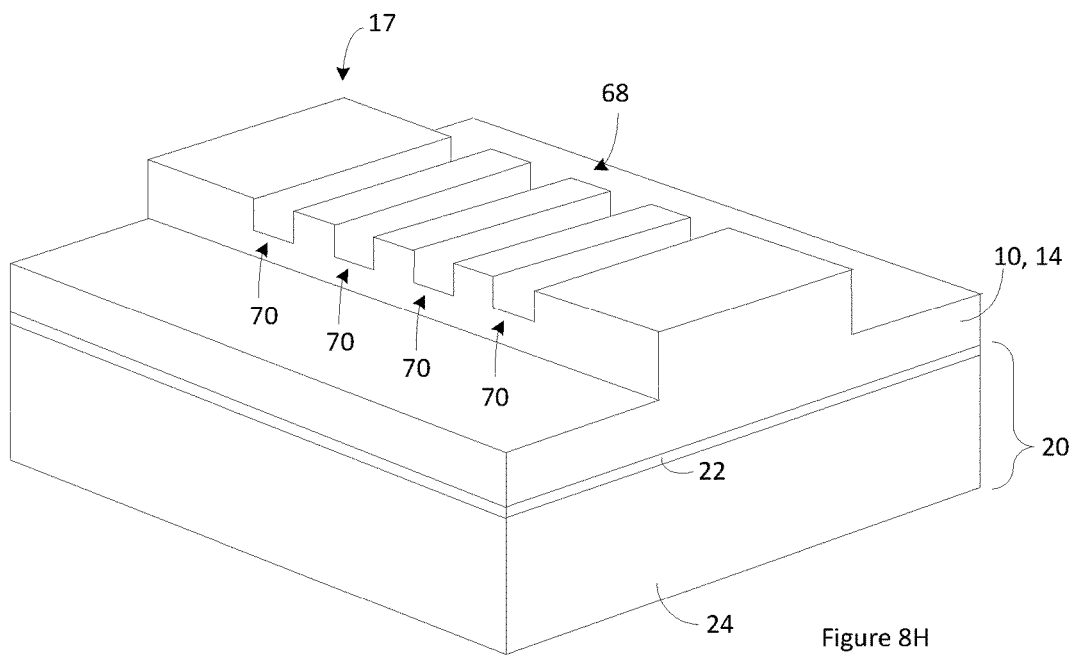
FIG. 8H is a perspective view of a Bragg grating integrated into a waveguide.

The Bragg gratings in each of FIG. 8A through FIG. 8G can be formed by recesses extending into the top of the laser waveguide. In particular, the Bragg gratings can be formed as a result of recesses extending into the top of the ridge 17 of the gain medium 10 or into the top of the ridge 17 of the light-transmitting medium 14. For instance, FIG. 8H is a perspective view of a portion of a device having a Bragg grating formed in a cavity waveguide 44 having a cross section as shown in FIG. 3B. The Bragg grating results from recesses 70 that each extends into the top of the ridge 17 of light-transmitting medium 14. Other structures can be employed to form a Bragg grating in the laser waveguide.

Figure 9A:
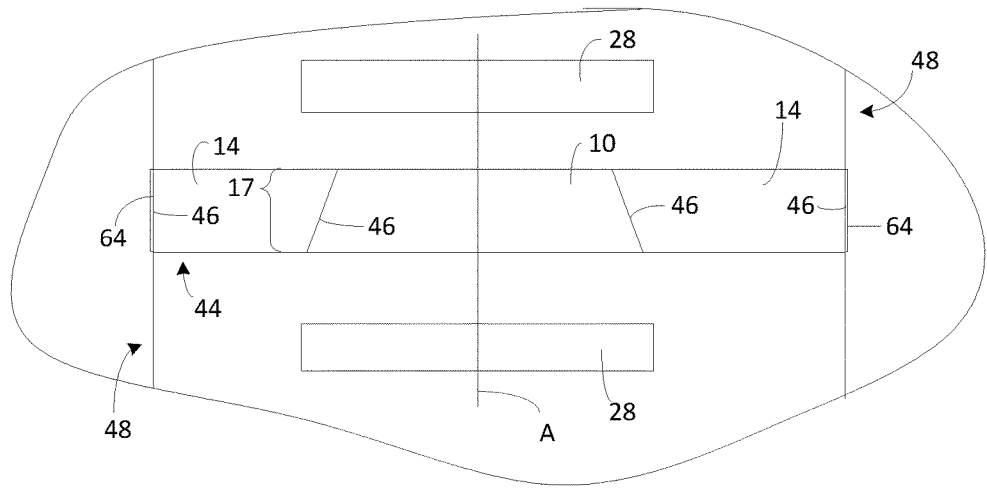
FIG. 9A through FIG. 9D illustrate conversion of the above laser cavities into amplifiers.

The above laser cavities can be converted to amplifiers by altering the high return component and/or the partial return component such that the light signal does not resonate within the cavity. For instance, the high return component and/or the partial return component can be removed from any of the above laser cavities order to provide a pass-through amplifier where a light signal passes through the amplifier once before exiting from the amplifier. In one example, a pass-through amplifier is achieved by replacing both the highly reflective coating 50 and the partially reflective coating 52 in any of the above laser cavities with an anti-reflective coating 64. As an example, FIG. 9A is a topview of the laser cavity of FIG. 3A with the high return component and the partial return component both replaced with an anti-reflective coating 64 so as to provide a pass-through amplifier. A cross section of the amplifier shown in FIG. 9A taken along the line labeled A can be represented by any of the structures shown in FIG. 1A through FIG. 2B. The laser waveguide of FIG. 3A now operates as an amplifier waveguide. For instance, a light signal received in the amplifier waveguide is intensity amplified as it is guided through the active region of the amplifier to a facet 46 through which the amplifier light signal exits the amplifier.

Figure 9B:
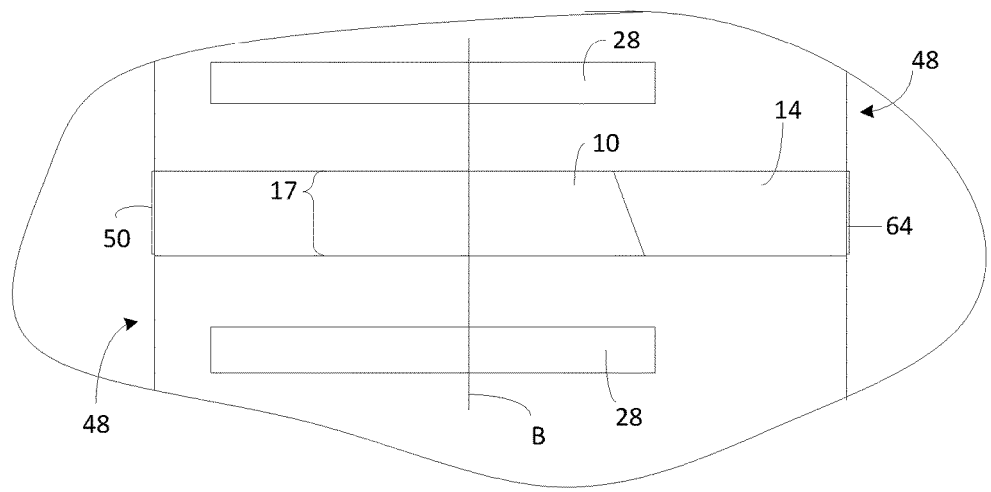

In some instances, only the part return component is removed from any of the above laser cavities to provide a reflective amplifier. In one example, the reflective amplifier is achieved by replacing the partial return component in any of the above laser cavities with an anti-reflective coating 64. As an example, FIG. 9B is a topview of the laser cavity of FIG. 3B with the highly reflective coating 50 replaced with an anti-reflective coating 64 so as to provide a reflective amplifier. A cross section of the amplifier shown in FIG. 9B taken along the line labeled A can be represented by any of the structures shown in FIG. 1A through FIG. 2B. The laser waveguide of FIG. 3A now operates as an amplifier waveguide. For instance, a light signal received in the amplifier waveguide is intensity amplified as it is guided through the active region of the amplifier to the highly reflective coating 50 which returns the light signal back to the amplifier waveguide. The returned light signal is again amplified as it is guided through the active region of the amplifier a second time before exiting the amplifier through the anti-reflective coating 64.

The above amplifiers are easily integrated into a device that includes other optical components 60. For instance, FIG. 9C and FIG. 9D illustrate a device that includes one of the above amplifiers guiding light signals between other optical components 60 on the device.

Figure 9C:
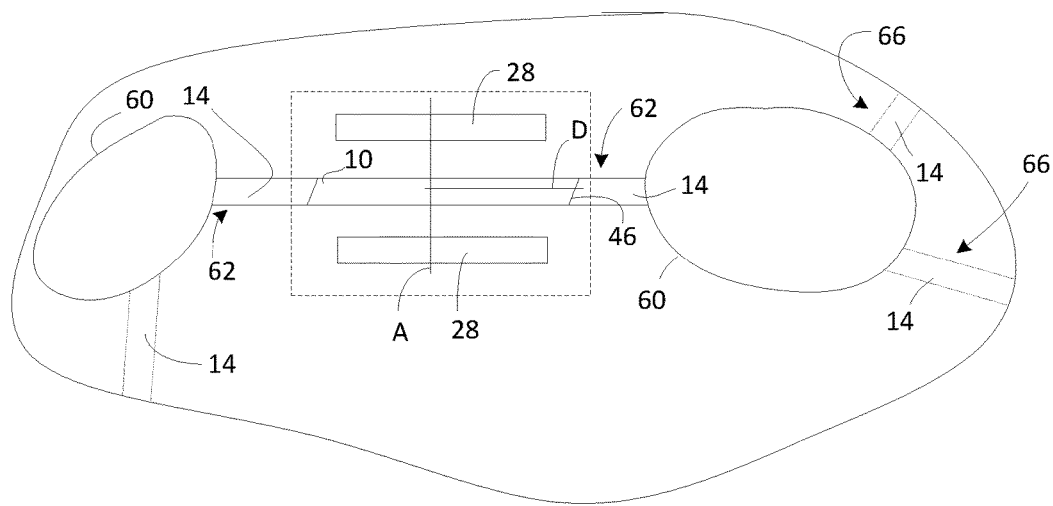
Figure 9D:
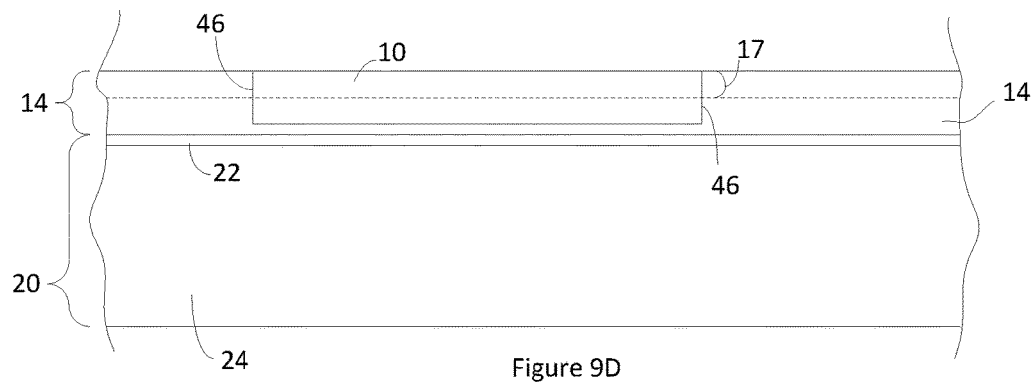

FIG. 9C is a topview of a portion of the device and FIG. 9D is a cross section of the device taken along the line labeled D in FIG. 9C. The dashed line in FIG. 9C surrounds the location of the amplifier on the device but does not show any structural feature of the device. A cross section of the amplifier shown in FIG. 9C taken along the line labeled A can be represented by any of the structures shown in FIG. 1A through FIG. 2B.

As is evident in FIG. 9D, the light-transmitting medium 14 included in the ridge 17 of the component waveguide 62 is continuous with the seed portion 12 of the light-transmitting medium 14 positioned under the gain medium 10.

The amplifier of FIG. 9C is positioned between optical components 60 and accordingly amplifies light signals exchanged between those optical components 60. Since the high return component the partial return component have been removed from one of the above laser cavities in order to provide a pass-through amplifier, coatings need not be present between facet 46 of the gain medium 10 and the facet 46 of the light-transmitting medium 14. As a result, the interface can be a direct interface where the facet 46 of the gain medium 10 contacts the fact of the light-transmitting medium 14. Accordingly, a facet recess 56 need not be formed between the component waveguide 62 and the gain waveguide 42 as shown in FIG. 6A. Interfaces between facet 46 of the gain medium 10 and the facet 46 of the light-transmitting medium 14 can be angled at less than 90° relative to the direction of propagation of light signals through the gain waveguide 42 at the interface. Angling the interface at less than 90° can reduce the effects of back reflection at the interface.

Several of the optical devices disclosed above include one or more optical components 60 in addition to the disclosed laser or amplifier. Examples of optical components 60 that can be integrated onto the device along with the laser include, but are not limited to, one or more components 60 selected from a group consisting of facets 46 through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, amplifiers for amplifying the intensity of a light signal, attenuators for attenuating the intensity of a light signal, modulators for modulating a signal onto a light signal, modulators that convert an light signal to an electrical signal, and vias that provide an optical pathway for a light signal traveling through the base 20 device from the bottom side of the device to the top side of the device.

A component 60 of particular interest for integrating with the above lasers is an optical modulator. Examples of modulators that can serve as the component 60 include but are not limited to, the modulators disclosed in U.S. patent application Ser. No. 13/385,774, filed on Mar. 5, 2012, entitled "Integration of Components on Optical Device;" U.S. patent application Ser. No. 13/385,099, filed on Feb. 1, 2012, entitled "Optical Component Having Reduced Dependency on Etch Depth;" U.S. patent application Ser. No. 13/374,784, filed on Jan. 12, 2012, entitled "Optical Device Having Reduced Optical Leakage," U.S. patent application Ser. No. 12/660,149, filed on Feb. 19, 2010, entitled "Reducing Optical Loss in an Optical Modulator Using Depletion Region;" U.S. patent application Ser. No. 12/653,547, filed on Dec. 15, 2009, entitled "Optical Device Having Modulator Employing Horizontal Electrical Field," U.S. patent application Ser. No. 11/146,898, filed on Jun. 7, 2005, entitled "High Speed Optical Phase Modulator;" and in U.S. patent application Ser. No. 11/147,403, filed Jun. 5, 2005, entitled "High Speed Optical Phase Modulator;" each of which is incorporated herein in its entirety.

The width of the ridge 17 of gain medium 10 is labeled w in FIG. 1A. A suitable width for the ridge 17 of gain medium 10 includes widths wider than 0.3, 0.6, or 0.8 µm and/or less than 1.2, 2, or 4 µm. As noted above, the component waveguides 62 can have a cross section as shown in FIG. 3B. The width of the ridge 17 of the light-transmitting medium 14 is labeled W in FIG. 3B. When a component waveguide 62 has a cross section according to FIG. 3B, a suitable width for the ridge 17 of gain medium 10 includes widths wider than 0.3, 0.6, or 0.8 µm and/or less than 1.2, 2, or 4 µm. When there is a mismatch between the width of the ridge 17 of gain medium 10 and the ridge 17 of light-transmitting medium 14 for a component waveguide 62, the laser waveguide can include a horizontal taper that provides a transition between the different widths. Additionally or alternately, this taper can be present along the length of the component waveguide 62.

The thickness of the ridge 17 of the laser waveguide is labeled t in FIG. 1A. A suitable thickness for the ridge 17 of the laser waveguide includes a thickness greater than 1, 2, or 2.5 µm and/or less than 3.5, 4, or 5 µm. The height of the ridge 17 of gain medium 10 is labeled h in FIG. 1A. A suitable height for the ridge 17 of gain medium 10 includes heights greater than 1, 2, or 2.5 µm and/or less than 3.5, 4, or 5 µm. The thickness of the ridge 17 of light-transmitting medium 14 is labeled T in FIG. 3B. When a component waveguide 62 has a cross section according to FIG. 3B, a suitable thickness for the ridge 17 of component waveguide 62 includes a thickness (T) greater than 1, 2, or 2.5 µm and/or less than 3.5, 4, or 5 µm. The height of the ridge 17 of light-transmitting medium 14 is labeled H in FIG. 3B. When a component waveguide 62 has a cross section according to FIG. 3B, a suitable height for the ridge 17 of light-transmitting medium 14 includes a height greater than 0.5, 0.75, or 1 µm and/or less than 1.5, 2, or 2.5 µm. In some instances, any of the devices above is constructed such that a ridge 17 of the laser waveguide in the active region of the laser and a ridge 17 of light transmitting medium 14 included in a component waveguide 62 that receives a light signal from the laser waveguide have the same height and/or thickness. In some instances, any of the devices above is constructed such that a ridge 17 of the laser waveguide in the active region of the laser and a ridge 17 of light transmitting medium 14 included in a component waveguide 62 that receives a light signal from the laser waveguide have the same height and/or thickness but have different widths. The laser waveguide and a component waveguide 62 that receives the light signals from that laser waveguide can both be single mode or can both be multimode.

A suitable aspect ratio for the ridge 17 of gain medium 10 in the active region of the laser (ratio of height of the ridge 17 of active medium (h): width of the ridge 17 of gain medium 10 in the active region of the laser (w)) includes, but is not limited to, ratios greater than 1.5:1, 2:1, or 2.5:1 and/or less than 3.5:1, 4:1, or 5:1.

FIG. 10A through FIG. 18C illustrate a method of generating an optical device having a laser or amplifier with a cross section according to FIG. 1B and an interface where a facet 46 of the gain medium 10 contacts a fact of the light-transmitting medium 14. The method is illustrated using a silicon-on-insulator 22 wafer or chip as the starting precursor for the optical device. However, the method can be adapted to platforms other than the silicon-on-insulator 22 platform.

Figure 10A:
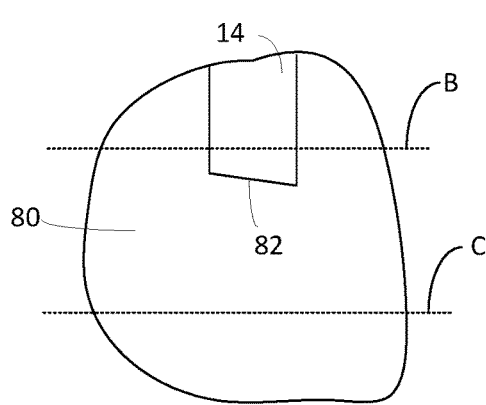
Figure 10B:
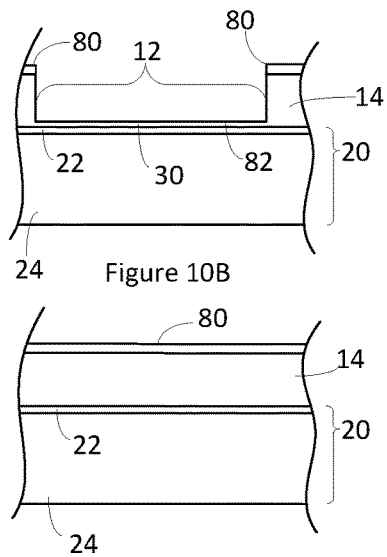
Figure 10C:
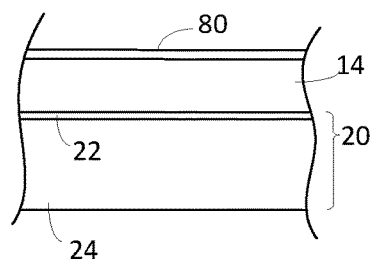

FIG. 10A through FIG. 10C illustrate a first mask 80 formed on the silicon-on-insulator 22 wafer or chip to provide a device precursor. FIG. 10A is a topview of the device precursor. FIG. 10B is a cross-section of the device precursor shown in FIG. 10A taken along the line labeled B. FIG. 10C is a cross-section of the device precursor shown in FIG. 10A taken along the line labeled C. The first mask 80 leaves exposed a region of the device precursor where a laser cavity 82 is to be formed while the remainder of the illustrated portion of the device precursor is protected. The laser cavity 82 is the region of the device precursor where the gain medium 10 is to be formed. A first etch is then performed so as to form the laser cavity 82. The first etch yields the device precursor of FIG. 10A through FIG. 10C. The first etch is performed such that the seed portion 12 of the light-transmitting medium 14 remains on the base 20. Accordingly, the first etch is terminated before the base 20 is reached.

A suitable first mask 80 includes, but is not limited to, a hard mask such as a silica mask. A suitable first etch includes, but is not limited to, a dry etch.

In instances where the seed portion 12 of the light-transmitting medium 14 is to be doped, the portion of the light-transmitting medium 14 that is exposed in FIG. 10A through FIG. 10C can be optionally be doped. In some instances, the seed portion 12 of the light-transmitting medium 14 is doped with an n-type dopant. Suitable methods for doping the seed portion 12 of the light-transmitting medium 14 include, but are not limited to, implantation.

Figure 11A:
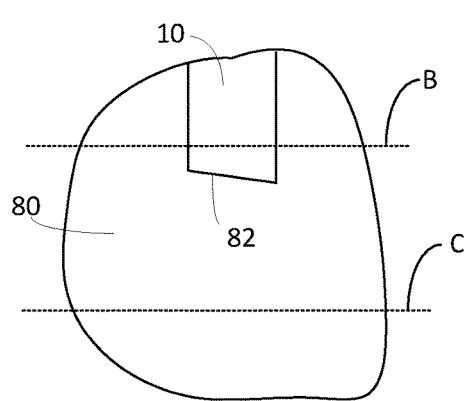
Figure 11B:
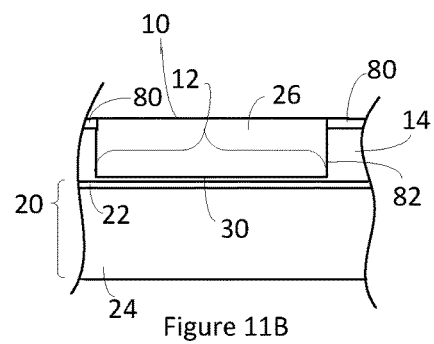
Figure 11C:
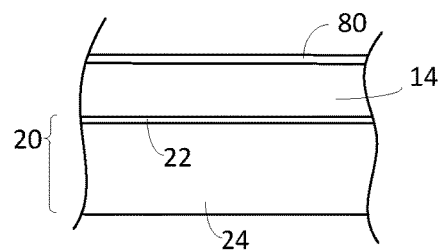

As shown in FIG. 11A through FIG. 11C, the gain medium 10 is formed in the laser cavity 82 of FIG. 10A through FIG. 10C. FIG. 11A is a topview of the device precursor. FIG. 11B is a cross-section of the device precursor shown in FIG. 11A taken along the line labeled B. FIG. 11C is a cross-section of the device precursor shown in FIG. 11A taken along the line labeled C. When the light-transmitting medium 14 is silicon and the gain medium 10 is germanium, the germanium can be grown on the seed portion 12 of the silicon. After formation of the gain medium 10, the gain medium 10 can be doped with an n-type dopant. Suitable methods for doping include, but are not limited to, delta-doping processes, ion implantation, and diffusion. As an alternative or in addition to doping the exposed seed portion 12 of the light-transmitting medium 14 shown in FIG. 10A and FIG. 10, the doping of the gain medium 10 can be performed so the seed portion 12 of the light-transmitting medium 14 is also doped. After doping of the gain medium 10 or before doping of the gain medium 10, the device precursor can be planarized to provide the device precursor of FIG. 11A through FIG. 11C.

Figure 12A:
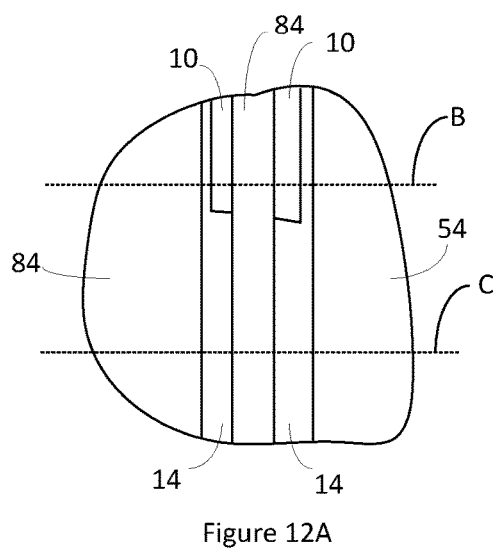
Figure 12B:
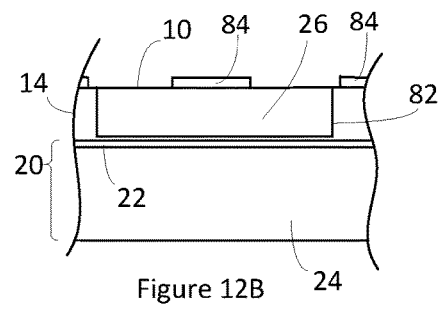
Figure 12C:
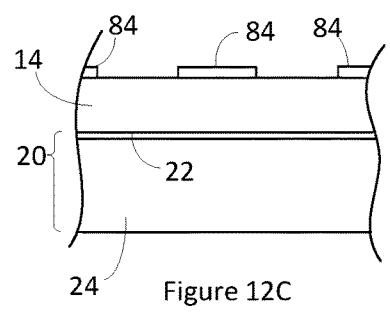

The first mask 80 can be removed from the device precursor of FIG. 11A through FIG. 11C and a second mask 84 can be formed on the device precursor so as to provide the device precursor of FIG. 12A through FIG. 12C. FIG. 12A is a topview of the device precursor. FIG. 12B is a cross-section of the device precursor shown in FIG. 12A taken along the line labeled B. FIG. 12C is a cross-section of the device precursor shown in FIG. 12A taken along the line labeled C. The second mask 84 is formed such that the regions where the slab regions 16 are to be formed remain exposed while protecting the remainder of the illustrated portion of the device precursor. For instance, the ridge 17 of the gain medium 10 and the ridge 17 of the light-transmitting medium 14 are protected. A suitable second mask 84 includes a hard mask such as a silica mask.

A second etch is performed on the device precursor of FIG. 12A through FIG. 12C to provide the device precursor of FIG. 13A through FIG. 13C. FIG. 13A is a topview of the device precursor. FIG. 13B is a cross-section of the device precursor shown in FIG. 13A taken along the line labeled B. FIG. 13C is a cross-section of the device precursor shown in FIG. 13A taken along the line labeled C. The second etch is stopped before etching through the gain medium 10 in order to provide the gain medium 10 with a cross section in accordance with any of FIG. 1A through FIG. 1C. As a result, a ridge 17 of the gain medium 10 extends upwards from slab regions 16 of the gain medium 10.

Since the second etch etches the light-transmitting medium 14 and the gain medium 10 concurrently, the second etch etches the light-transmitting medium 14 and the gain medium 10 to different depths. For instance, FIG. 13B illustrates the gain medium 10 etched deeper than the light-transmitting medium 14. A suitable second etch includes, but is not limited to, a dry etch that can etch both the light-transmitting medium 14 and the gain medium 10.

A third mask 86 is formed on the device precursor of FIG. 13A through FIG. 13C as shown by the device precursor of FIG. 14A through FIG. 14C. FIG. 14A is a topview of the device precursor. Although the location of the gain medium 10 is not visible from above the device precursor of FIG. 14A, the location of the gain medium 10 is illustrated as a dashed line in order to show the spatial relationship between the third mask 86 and the underlying gain medium 10. FIG. 14B is a cross-section of the device precursor shown in FIG. 14A taken along the line labeled B. FIG. 14C is a cross-section of the device precursor shown in FIG. 14A taken along the line labeled C. Portions of the third mask 86 are formed over the second mask 84. The third mask 86 is formed such that the combination of the second mask 84 and the third mask 86 leave the trenches associated with the ridge 17 of light-transmitting medium 14 exposed while the remainder of the illustrated portion of the device precursor is protected. A third etch is then performed so as to provide the device precursor of FIG. 14A through FIG. 14C. The third etch is performed such that the slab regions 16 in the gain medium 10 and in the light-transmitting medium 14 are about the thickness. As a result, the third etch corrects for the depth differential that is evident in FIG. 13B and FIG. 13C.

A suitable third mask 86 includes, but is not limited to, a photoresist. A suitable third etch includes, but is not limited to, a dry etch.

Figure 15A:
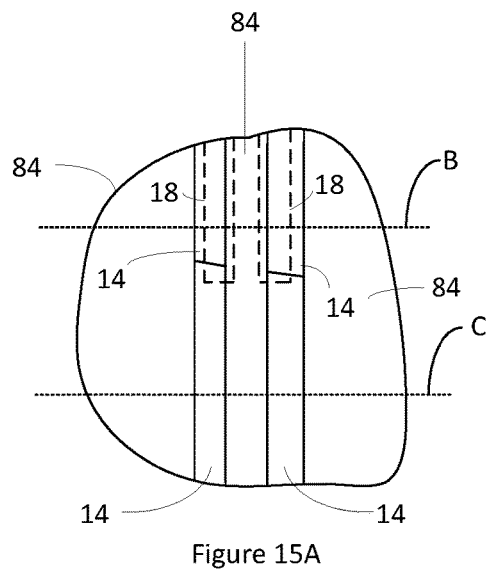
Figure 15B:
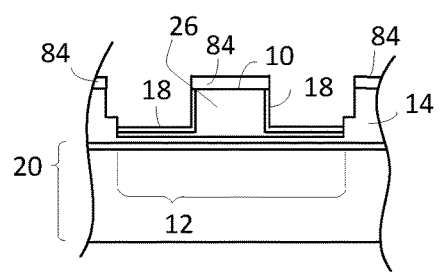
Figure 15C:
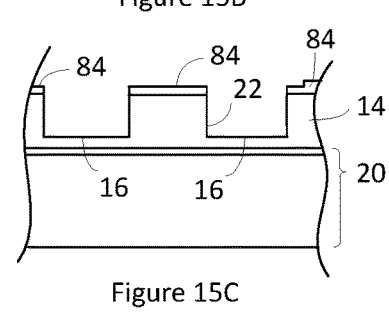

The third mask 86 is removed and a doped regions 18 and a second doped region 29 are formed in the gain medium 10 so as to provide the device precursor of FIG. 15A through FIG. 15C. FIG. 15A is a topview of the device precursor. FIG. 15B is a cross-section of the device precursor shown in FIG. 15A taken along the line labeled B. FIG. 15C is a cross-section of the device precursor shown in FIG. 15A taken along the line labeled C. Because the doped regions 18 overlap several different features on the precursor, in FIG. 15A, the locations of the doped regions 18 are shown by dashed lines so they can be distinguished from the overlapped features. Additionally, the location of the gain medium 10 in FIG. 15A is not shown in order to reduce confusion between the different features.

A doped region 18 can be generated by forming a doping mask on the device precursor so the locations of the doped regions 18 are exposed and the remainder of the illustrated portion of the device precursor is protected. High angle dopant implant processes can be employed to form the doped region 18. The doping mask can then be removed. The same sequence can then be employed to form a second doped regions 29. The second doped regions 29 can be formed before the doped region 18 or the doped regions 18 can be formed before the second doped region 29.

Figure 16A:
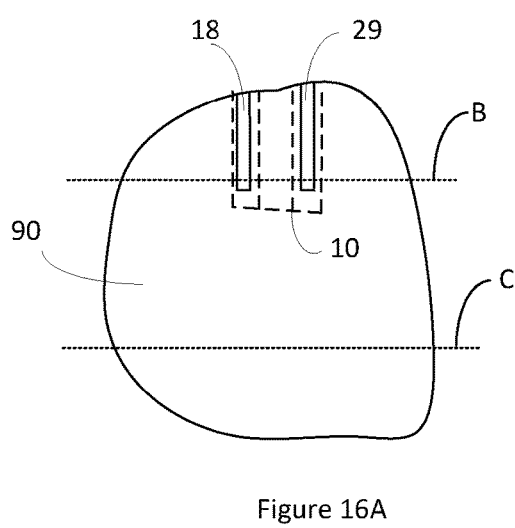
Figure 16B:
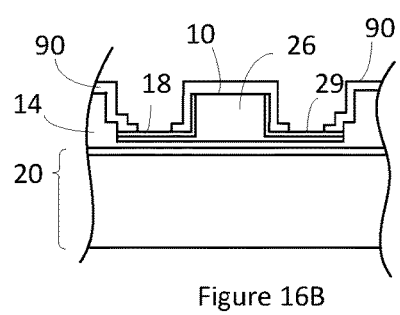
Figure 16C:
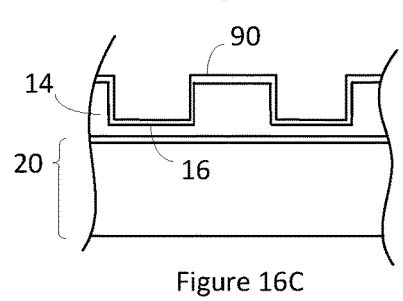

The second mask 84 is removed from the device precursor of FIG. 15A through FIG. 15C and a first cladding 90 is formed on the device precursor so as to provide the device precursor of FIG. 16A through FIG. 16C. FIG. 16A is a topview of the device precursor. Although the location of the gain medium 10 is not visible from above the device precursor of FIG. 16A, the gain medium 10 is illustrated as a dashed line in order to show the spatial relationship between features on the device precursor. FIG. 16B is a cross-section of the device precursor shown in FIG. 16A taken along the line labeled B. FIG. 16C is a cross-section of the device precursor shown in FIG. 16A taken along the line labeled C. As is evident in FIG. 16A and FIG. 16B, the first cladding 90 is formed such that the portion of the doped region 18 that is to be contacted by the electrical contact 28 remain exposed and the portion of the second doped region 29 that is to be contacted by the electrical contact 28 remain exposed. The first cladding 90 protects the remainder of the illustrated portion of the device precursor. A suitable first cladding 90 includes, but is not limited to, PECVD deposited silica that is subsequently patterned using photolithography.

Figure 17A:
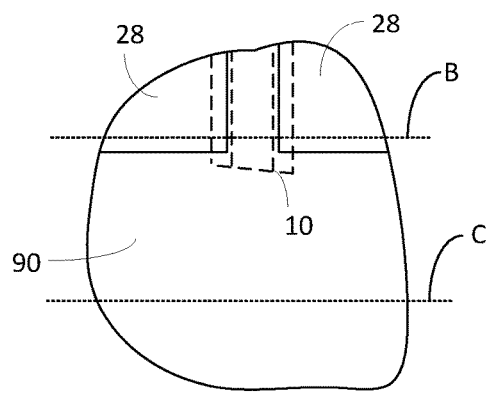
Figure 17B:
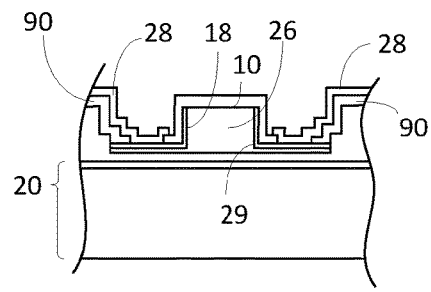
Figure 17C:
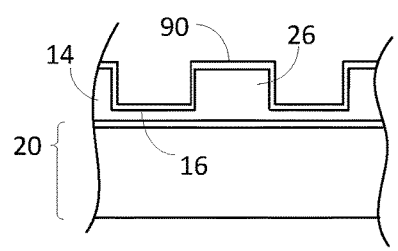

The electrical contacts 28 are formed on the device precursor of FIG. 16A and FIG. 16C so as to provide the device precursor of FIG. 17A through FIG. 17C. FIG. 17A is a topview of the device precursor. Although the location of the gain medium 10 is not visible from above the device precursor of FIG. 17A, the gain medium 10 is illustrated as a dashed line in order to show the spatial relationship between features on the device precursor. FIG. 17B is a cross-section of the device precursor shown in FIG. 17A taken along the line labeled B. FIG. 17C is a cross-section of the device precursor shown in FIG. 17A taken along the line labeled C. As is evident in FIG. 17A and FIG. 17B, the electrical contacts 28 can be formed so each electrical contact 28 extends from the doped regions 18 or the second doped region 29, out of a trench, and over the light-transmitting medium 14. Suitable electrical contacts 28 include metals such as titanium and aluminum. The metals can be deposited by sputtering and patterned by photolithography.

Figure 18A:
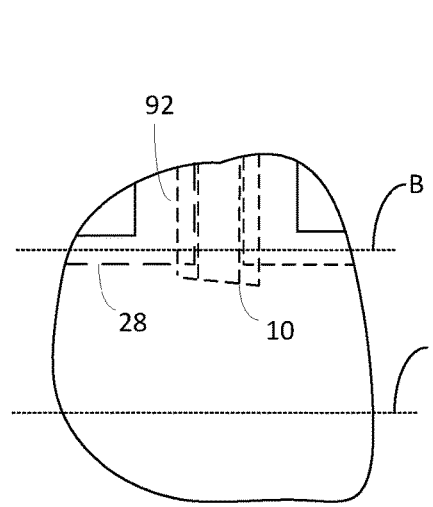
Figure 18B:
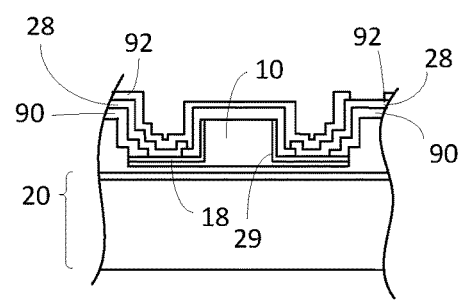
Figure 18C:
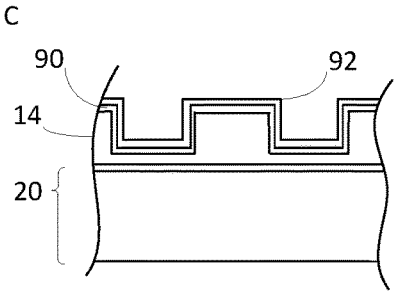

A second cladding 92 can optionally be formed on the device precursor of FIG. 17A through FIG. 17C so as to provide the device precursor of FIG. 18A through FIG. 18C. FIG. 18A is a topview of the device precursor. Although the location of the gain medium 10 and the electrical contacts 28 are not visible from above the device precursor of FIG. 18A, the gain medium 10 and electrical contacts 28 are each illustrated by dashed lines in order to show the spatial relationship between features on the device precursor. FIG. 18B is a cross-section of the device precursor shown in FIG. 18A taken along the line labeled B. FIG. 18C is a cross-section of the device precursor shown in FIG. 18A taken along the line labeled C. As is evident in FIG. 18A and FIG. 18B, the second cladding 92 can be patterned such that the second cladding 92 defines contact pads. A suitable second cladding 92 includes, but is not limited to, PECVD deposited SiN that is subsequently patterned using photolithography. After removing photoresists formed during photolithography, the device precursor of FIG. 18A through FIG. 18C can be sintered to form the optical device.

The drive electronics (not shown) that drive the laser or amplifier are in electrical communication with the contact pads. The electronics can apply electrical energy to the contact pads so as to drive an electrical current through the gain medium 10 as described above.

The device precursor produced by the method of FIG. 10A through FIG. 18C can be converted to a laser or amplifier by adding the appropriate high return component, partial return component, facet recess 56 and/or anti-reflective coating 64(s) in the locations disclosed above.

Although the method of FIG. 10A through FIG. 18C discloses fabrication of a laser according to FIG. 2B, the method is easily adapted to provide lasers having the other cross sections. For instance, the above method describes the second etch as etching part way through the gain medium 10 in order to provide the gain medium 10 with the cross section of FIG. 1A through FIG. 1C. However, second etch can etch through the gain medium 10 to provide the gain medium 10 with a cross section in accordance with any of FIG. 1D through FIG. 1F. Alternately, the second etch can etch through the light-transmitting medium 14 and into the base 20 to provide the gain medium 10 with a cross section in accordance with FIG. 1G. Additionally, lasers according to FIGS. 1A and 1D can be generated by foregoing the formation of the second doped region 29. Lasers according to FIGS. 1C and 1F can be generated by forming the doped region 18 and the second doped region 29 in only the slab regions 16. Lasers according to FIG. 1G can be generated by forming neither the doped region 18 nor the second doped region 29 and instead using other methods to form the current carriers 32 on the ridge 17 of gain medium 10.

During the process of forming the doped region 18 and/or the second doped region 29 in a laser constructed according to FIG. 1D and FIG. 1E, the doped region 18 and/or the second doped region 29 is formed in both the light-transmitting medium 14 and the gain medium 10. In some instances, the portion of each doped region 18 located in the light-transmitting medium 14 is formed concurrently with the portion of the doped region 18 located in the gain medium 10 rather than the two different portions being formed sequentially. Additionally or alternately, a portion of each second doped region 29 located in the light-transmitting medium 14 is formed concurrently with the portion of the second doped region 29 located in the gain medium 10 rather than the two different portions being formed sequentially. As a result, in some instances, the portion of the doped region 18 in the light-transmitting medium 14 has the same concentration of dopant, or about the same concentration, as the portion of the doped region 18 in the gain medium 10 and/or the portion of the second doped region 29 in the light-transmitting medium 14 has the same concentration of dopant, or about the same concentration, as the portion of the second doped region 29 in the gain medium 10.

Although the above masks are described as the first mask 80, second mask 84, etc., the number first, second, and third does not indicate sequence but instead provides an identifier that indicates different masks. As a result, it may be possible to generate the desired device by forming a mask with a higher number before forming the lower numbered mask.

The above devices are within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of a substrate included in the base, and/or the bottom side of the substrate.

Although the laser cavities in devices such as FIGS. 6A, 8E and 8F are shown positioned at an edge 48 of the device, these laser cavities can be centrally positioned on the device as shown in FIG. 8G.

Although the above devices illustrate a single laser cavity on a device, the ease with which these laser cavities can be directly integrated into the device allows for multiple laser cavities to be included on a single device. Accordingly, in some instances, the device includes an array of the laser cavities.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
    a laser positioned on a base, the laser including a ridge of a gain medium positioned on the base such that the base extends out from under the ridge,
        the ridge including a top that connects lateral sides of the ridge; and
    electronics configured to drive an electrical current through the ridge such that the electrical current passes through one or more of the lateral sides of the ridge.

2. The device of claim 1, wherein the gain medium is an indirect bandgap material.

3. The device of claim 1, wherein the gain medium includes one or more elements selected from group IV.

4. The device of claim 1, wherein the gain medium is doped with an n-type material at a concentration higher than $1 \times 10^{18}$ cm$^{-1}$.

5. The device of claim 1, wherein the gain medium has multiple energy conduction bands and the lowest energy conduction band of the gain medium is associated with an indirect bandgap but the next lowest energy conduction band of the gain medium is associated with a direct bandgap.

6. The device of claim 1, wherein the gain medium has multiple energy conduction bands and the lowest energy conduction band of the gain medium is associated with an indirect bandgap and the gain medium is stressed and doped such that the lowest energy conduction band is filled with electrons during operation of the laser.

7. The device of claim 6, wherein the gain medium is bonded directly to a light-transmitting medium positioned between the base and the gain medium, the bond being such that a lattice mismatch between the gain medium and the light-transmitting medium stresses the gain medium.

8. The device of claim 1, wherein at least one electrical conductor contacts a lateral side of the gain medium and the electronics are configured such that the electrical current passes through the at least one electrical conductors and the ridge of the gain medium.

9. The device of claim 1, wherein the at least one electrical conductor is a doped region of the gain medium doped such that the gain medium behaves as an electrical conductor.

10. The device of claim 1, wherein electrical conductors each contacts a lateral side of the gain medium on opposing sides of the ridge of the gain medium and the electronics are configured such that the electrical current passes through each of the electrical conductors and the ridge of the gain medium.

11. The device of claim 1, wherein the at least one electrical conductor is a doped region of the gain medium doped such that the gain medium behaves as an electrical conductor.

* * * * *